(12) United States Patent
Clerc et al.

(10) Patent No.: US 12,156,371 B2
(45) Date of Patent: Nov. 26, 2024

(54) METHODS AND SYSTEMS FOR FLUID IMMERSION COOLING

(71) Applicant: CGG SERVICES SAS, Massy (FR)

(72) Inventors: Laurent Clerc, Houston, TX (US); Jean-Yves Blanc, Longjumeau (FR); Emilie Lelogeais, Cachan (FR)

(73) Assignee: CGG Services SAS, Massy (FR)

( * ) Notice: Subject to any disclaimer, the term of this patent is extended or adjusted under 35 U.S.C. 154(b) by 277 days.

(21) Appl. No.: 17/735,765

(22) Filed: May 3, 2022

(65) Prior Publication Data

US 2022/0369504 A1 Nov. 17, 2022

Related U.S. Application Data

(60) Provisional application No. 63/315,210, filed on Mar. 1, 2022, provisional application No. 63/189,392, filed on May 17, 2021.

(51) Int. Cl.
*H05K 7/20* (2006.01)

(52) U.S. Cl.
CPC ..... *H05K 7/20236* (2013.01); *H05K 7/20263* (2013.01); *H05K 7/20272* (2013.01); *H05K 7/20772* (2013.01)

(58) Field of Classification Search
CPC ........... H05K 7/20236; H05K 7/20263; H05K 7/20272; H05K 7/20772; H05K 7/20781;
(Continued)

(56) References Cited

U.S. PATENT DOCUMENTS

| 10,257,963 B2 | 4/2019 | Ozyalcin et al. |
| 10,349,555 B2 | 7/2019 | Barragy et al. |

(Continued)

FOREIGN PATENT DOCUMENTS

| CN | 212 341 825 U | 1/2021 |
| CN | 213694613 U * | 7/2021 |

(Continued)

OTHER PUBLICATIONS

Office Action Issued in Corresponding EP Application No. 22 305 653.2, dated Aug. 18, 2023. (7 pages).

(Continued)

*Primary Examiner* — Ana M Vazquez
(74) *Attorney, Agent, or Firm* — Osha Bergman Watanabe & Burton LLP

(57) ABSTRACT

A system for cooling an electronic component includes a cylindrical container, a support, a heat exchanger, and one or more micropumps. The cylindrical container includes an internal volume that stores dielectric liquid. The internal volume is formed by an interior wall and a bottom of the cylindrical container. The support is positioned in the internal volume of the cylindrical container, and retains the electronic component within the dielectric liquid stored in the internal volume of the cylindrical container. The support also controls a flow of the dielectric liquid. The heat exchanger is positioned in the cylindrical container and circulates water from an external environment of the cylindrical container into and out of the internal volume of the cylindrical container. The one or more micropumps are integrally formed with and powered by the electronic component, and circulate the dielectric liquid through the electronic component.

16 Claims, 12 Drawing Sheets

(58) Field of Classification Search
CPC ..... H05K 7/20763; G06F 1/20; H01L 23/345;
H01L 23/473
See application file for complete search history.

(56) References Cited

U.S. PATENT DOCUMENTS

| | | |
|---|---|---|
| 10,568,234 B1 | 2/2020 | Mao et al. |
| 10,791,647 B1 | 9/2020 | Miyamura et al. |
| 2016/0381840 A1 | 12/2016 | Peterson et al. |
| 2018/0343770 A1 | 11/2018 | Brink |
| 2019/0219311 A1* | 7/2019 | Smith ................ H05K 7/20236 |
| 2019/0383559 A1 | 12/2019 | Aoki et al. |
| 2020/0288600 A1* | 9/2020 | Gao .................... H05K 7/20272 |
| 2022/0322572 A1* | 10/2022 | Chehade ............ H05K 7/20327 |

FOREIGN PATENT DOCUMENTS

| | | |
|---|---|---|
| CN | 214 592 559 U | 11/2021 |
| CN | 214592559 | 11/2021 |
| CN | 216 017 518 U | 3/2022 |

OTHER PUBLICATIONS

Extended European Search Report in corresponding/related European Application No. 22305653.2 dated Oct. 13, 2022.
Office Action issued in counterpart European Patent Application No. EP 22305653.2 mailed Feb. 27, 2024 (5 pages).

* cited by examiner

METHODS AND SYSTEMS FOR FLUID IMMERSION COOLING

TECHNICAL FIELD

Embodiments of the subject matter disclosed herein relate to fluid immersion cooling of electronic systems.

BACKGROUND

Computing systems are utilized to control all aspects of the seismic data acquisition surveys including the collection and processing of seismic data. Due to the large volume of data collection and the complexity involved in processing the data, a significant amount of computing power is required. Computing systems with the required amount of computing power generate significant heat and need to be cooled. As seismic data acquisition surveys typically occur in remote areas or at sea and the amount of computing capacity varies among applications, the computing systems and associated cooling mechanisms need to be robust, portable, and modular. In addition, the need to control or limit power consumption in the field places a further constraint on these computer systems and cooling mechanisms.

In general, electronic systems generate heat as they operate. The generated heat needs to be removed to ensure that the components contained in the electronic systems remain within their designed temperature range. The generated heat is removed from the electronic systems by running a cooling fluid through the electronic systems. Conventional cooling fluids include gases, e.g., air, liquids or combinations of gases and liquid. The cooling fluid removes the heat from the electronic equipment in the electronic systems and carries that heat to a location external to the electronic system. At this external location, the heat is exchanged with another fluid or is directly dissipated into the ambient environment.

In computing systems, the need to cool computing systems such as large server farms and the energy costs associated with the cooling of these computing systems drive the development of innovative and energy efficient cooling systems. The more energy efficient cooling systems favor oil immersion cooling over forced air systems or cooling fluid circulated heat sinks or cooling jackets. In an oil immersion cooling system, the electronic components to be cooled are at least partially immersed in dielectric oil. The dielectric oil, being in contact with the electronic components, conducts heat away from the electronic components. To remove the transferred heat from the dielectric oil, the dielectric oil is circulated, for example, using a pump, through a heat exchanger, through which a separate cooling liquid is also circulated. This heat exchanger can be located external to the container holding the dielectric oil and the electronic components or internal to the container.

An example of a liquid immersion cooling solution for data center servers is the CarnoJet System, which is commercially available from Green Revolution Cooling of Austin, Tex. The CarnoJet System utilizes a 'pump module' containing a primary pump, a secondary pump, an oil/water heat exchanger, and a control mechanism. Associated with each pump module is one or more custom built steel tanks filled with heat generating information technology (IT) equipment immersed in the dielectric coolant termed GreenDef, which is broadly similar to mineral oil. The IT equipment in the tank is supported on a built in 'rack' rail system. The pump module and tanks are connected via hoses. The pump circulates oil through the heat exchanger and back to the tanks. Cooling water is supplied to the heat exchanger from an external source. While this system cools high thermal density IT equipment very effectively, it has several shortcomings particularly regarding cost, size and complexity.

The efficiency, redundancy and maintainability of the cooling process generally depends on the mass, electrical chemical and thermal properties of the cooling fluid used, the amount or volume of cooling fluid, the required fluid flow, the amount of energy consumed by the required fluid circulation system, and the complexity of the circulation system necessary to circulate the cooling fluid.

As seismic data processing requires a large number of electronic systems contained in High Performance Computing centers, improving the efficiency, redundancy and operational flexibility of the cooling systems is a desirable outcome for that activity.

SUMMARY

Exemplary embodiments are directed to systems for immersion cooling electronic components such as computing system equipment using cylindrical containers having a circular cross section such as metal barrels used to transport and store immersion cooling fluids. These systems include one or more cooling elements disposed within the cylindrical container to provide for a flow of a first or primary cooling fluid into and out of the cylindrical container, and a volume of second cooling fluid disposed in the container and surrounding the one or more cooling elements disposed within the container. The second cooling fluid is an immersion cooling fluid such as the immersion cooling fluid supplied in the container. At least one heat generating electronic component is disposed within the cylindrical container in the volume of immersion cooling fluid, and at least one micropump is disposed in the at least one heat generating electronic component. The micropump provides for the flow of the secondary cooling fluid through the electronic component and the one or more cooling elements to remove heat from the at least heat generating electronic component and to transfer heat between the secondary cooling fluid and the primary cooling fluid.

Exemplary embodiments are also directed to methods for immersion cooling heat generating electronic components. The lid of a cylindrical barrel, such as a cylindrical barrel used to transport and store an immersion cooling fluid, is removed, and one or more cooling elements are placed within the cylindrical barrel. The cooling elements are connected to a source of primary cooling fluid such as water. The cylindrical barrel is filled with a volume of second cooling fluid sufficient to surround the one or more cooling elements disposed within the container. The second cooling fluid is an immersion cooling fluid, and in one embodiment, the second cooling fluid is the immersion cooling fluid shipped in the cylindrical barrel. Therefore, the second cooling fluid is already contained within the cylindrical barrel and does not need to be added. In one embodiment, a portion of the volume of the second cooling fluid is removed to accommodate insertion of the other components.

At least one heat generating electronic component is placed within the cylindrical barrel in the volume of immersion cooling fluid. The first or primary cooling fluid is circulated through the one or more cooling elements and into and out of the cylindrical barrel, and a micropump, for example, disposed in the at least one heat generating electronic component is used to circulate the second cooling fluid through the electronic component and the one or more cooling elements to remove heat from the at least heat generating electronic component and to transfer heat between the second cooling fluid and the first cooling fluid.

Exemplary embodiments are directed to a system for immersion cooling electronic components that includes a cylindrical container having a circular cross section, a cooling element disposed in the cylindrical container and containing a first cooling fluid, a volume of a second cooling fluid disposed in the cylindrical container and in contact with the cooling element for exchange of heat between the second cooling fluid and the first cooling fluid, where the second cooling fluid is an immersion cooling fluid, a heat generating electronic component disposed within the cylindrical container and at least partially immersed in the second cooling fluid for exchange of heat between the electronic component and the second cooling fluid, and a fluid circulating device disposed in the second cooling fluid to direct a flow of the second cooling fluid through the electronic component and over the cooling element.

In one embodiment, the cylindrical container is a metal barrel used to ship the second cooling fluid. In one embodiment, the cooling element includes an inlet for introducing the first cooling fluid into the cooling element from a source external to the cylindrical container and an outlet, separate from the inlet, for removing heated first cooling fluid from the cooling element. In one embodiment, the system further includes two cooling elements. Each cooling element is located between the electronic component and an interior wall of the cylindrical container, and the two cooling elements are arranged on diametrically opposed sides of the electronic component. In one embodiment, the first cooling fluid is water, and the second cooling fluid is a dielectric oil. In one embodiment, the electronic component is completely immersed in the second cooling fluid.

In one embodiment, the electronic component includes a face containing power and communication connections and a depth extending back from the face. The electronic component is disposed in the cylindrical container with the face accessible through an open top of the cylindrical container and the depth extending vertically in the cylindrical container. In one embodiment, the face has two opposing side edges, a top edge and a bottom edge opposite the top edge. The top and bottom edges extend between the side edges. The electronic component has two sides extending along the depth from the two side edges, a top extending along the depth from the top edge and a bottom extending along the depth from the bottom edge, and the cooling element is disposed adjacent one of the side edges. In one embodiment, the system includes a plurality of electronic components arranged in the cylindrical container as a stack with the sides of all electronic components aligned. The cooling element is position between one of the aligned sides of the plurality of electronic components and an interior wall of the cylindrical container.

In one embodiment, the fluid circulating device is a micropump integrated into the electronic component. In one embodiment, the micropump receives power from the electronic component. In one embodiment, the electronic component has a face containing power and communication connections and a depth extending back from the face, and the system includes a support disposed in the cylindrical container. The support includes a support platform spaced from a bottom of the cylindrical container along a height of the cylindrical container a distance at least equal to the depth and is arranged to hold the electronic component in the cylindrical container with the depth positioned vertically in the cylindrical container. In one embodiment, the face has two opposing side edges, a top edge, and a bottom edge spaced from the top edge, the top edge and bottom edge extending between the opposing side edges, and the electronic component includes two sides extending along the depth from the two side edges, a top extending along the depth from the top edge and a bottom extending along the depth from the bottom edge. The support platform has a central opening with opposing support rails engaging the opposing side edges of the face and supporting the electronic component.

In one embodiment, the system further contains a plurality of electronic components arranged in the cylindrical container as a stack with the sides of all electronic components aligned, the opposing support rails engaging the opposing side edges of all faces and supporting all electronic components. In one embodiment, the support platform has a cooling element opening positioned between one of the opposing support rails and an interior wall of the cylindrical container, and the cooling element is disposed in the cooling element opening. In one embodiment, the support platform includes a containment section with a deck and a lip extending up from the deck in a direction opposite the base around an entire periphery of the deck. The central opening and the cooling element opening are disposed in the deck, and the deck and lip direct a flow of second cooling fluid emerging from the face of the electronic component through the cooling element opening and along the cooling element.

Exemplary embodiments are also directed to a system for immersion cooling computer system components that includes a cylindrical container having a circular cross section, a plurality of separate cooling elements disposed in the cylindrical container with each cooling element containing a first cooling fluid, a volume of a second cooling fluid disposed in the cylindrical container and in contact with each cooling element for exchange of heat between the second cooling fluid and the first cooling fluid with the second cooling fluid being an immersion cooling fluid, a plurality of heat generating electronic components disposed within the cylindrical container and completely immersed in the second cooling fluid for exchange of heat between the electronic component and the second cooling fluid, and a plurality of fluid circulating devices disposed in the second cooling fluid to direct a flow of the second cooling fluid through each electronic component and over the plurality of cooling elements.

In one embodiment, the cylindrical container is a metal barrel used to ship the second cooling fluid, and the fluid circulating devices are micropumps integrated into the electronic components and receiving power from the electronic components. In one embodiment, each electronic component has a face with two opposing side edges, a top edge, and a bottom edge spaced from the top edge, the top edge and bottom edge extending between the opposing side edges, a depth extending back from the face and two sides extending along the depth from the two side edges. The plurality of electronic components is arranged in the cylindrical container as a stack with the sides of all electronic components aligned. The plurality of cooling elements contains two cooling elements, and the system further includes a support disposed in the cylindrical container. In one embodiment, the support includes a support platform spaced from a bottom of the cylindrical container along a height of the cylindrical container a distance at least equal to the depth. The support platform has a containment section including a deck with a central opening comprising opposing support rails engaging the opposing side edges of all of the faces and supporting all electronic components in the cylindrical container with the depth positioned vertically in the cylindrical container, and two cooling element openings. Each cooling element opening is positioned between one of the opposing support rails and an interior wall of the cylindrical container on diametrically opposed sides of the plurality of electronic components, and each cooling element is disposed in one of the cooling element openings. The containment section also includes a lip extending up from the deck in a direction opposite the base around an entire periphery of the deck. The deck and lip direct a flow of second cooling fluid emerging from the faces of the electronic components through the cooling element openings and along the cooling elements.

Exemplary embodiments are also directed to a method for immersion cooling electronic components. A top of a cylindrical barrel containing an immersion cooling fluid is opened, and a support is placed within the cylindrical barrel. The support is used to hold at least one heat generating electronic component in the cylindrical barrel such that the electronic component is completely immersed in the immersion cooling fluid. At least one cooling element is immersed in the immersion cooling fluid within the cylindrical barrel adjacent the at least one electronic component, and cooling water from a source external to the cylindrical barrel is circulated through the at least one cooling element. At least one micropump integrated into the at least one electronic component and deriving power from the at least one electronic component is used to direct a flow of the immersion cooling fluid vertically up through the at least one electronic component and vertically down over the at least one cooling element to transfer heat from the at least one electronic component through the immersion cooling fluid and to the cooling water for removal from the cylindrical barrel.

Exemplary embodiments are directed to a system for immersion cooling electronic components. The system includes a cylindrical container having a circular cross section, a cooling element disposed in the cylindrical container and containing a first cooling fluid, a volume of a second cooling fluid, which is an immersion cooling fluid, disposed in the cylindrical container and in contact with the cooling element for exchange of heat between the second cooling fluid and the first cooling fluid, a heat generating electronic component disposed within the cylindrical container and at least partially immersed in the second cooling fluid for exchange of heat between the electronic component and the second cooling fluid, and a fluid circulating device disposed in the second cooling fluid to direct a flow of the second cooling fluid through the electronic component and over the cooling element.

The cylindrical container may include a metal barrel used to ship the second cooling fluid. In one embodiment, the cooling element includes an inlet for introducing the first cooling fluid into the cooling element from a source external to the cylindrical container, and an outlet, separate from the inlet, for removing heated first cooling fluid from the cooling element. In one embodiment, the system includes two cooling elements. Each cooling element is located between the electronic component and an interior wall of the cylindrical container, and the two cooling elements are arranged on diametrically opposed sides of the electronic component. In one embodiment, the first cooling fluid is water. In one embodiment, the second cooling fluid is a dielectric oil. In one embodiment, the electronic component is completely immersed in the second cooling fluid. In one embodiment, the electronic component has a face including power and communication connections and a depth extending back from the face. The electronic component is disposed in the cylindrical container with the face accessible through an open top of the cylindrical container and the depth extending vertically in the cylindrical container. In one embodiment, the face has two opposing side edges, a top edge and a bottom edge opposite the top edge. The top and bottom edges extend between the side edges. The electronic component includes two sides extending along the depth from the two side edges, a top extending along the depth from the top edge and a bottom extending along the depth from the bottom edge. The cooling element is disposed adjacent one of the side edges.

The system may further include a plurality of electronic components arranged in the cylindrical container as a stack with the sides of all electronic components aligned. The cooling element is positioned between one of the aligned sides of the plurality of electronic components and an interior wall of the cylindrical container. The fluid circulating device has a micropump integrated into the electronic component and receiving power from the electronic component. The electronic component has a face that includes power and communication connections and a depth extending back from the face. In one embodiment, the system further includes a support disposed in the cylindrical container. The support includes a support platform spaced from a bottom of the cylindrical container along a height of the cylindrical container a distance at least equal to the depth. The support platform is arranged to hold the electronic component in the cylindrical container with the depth positioned vertically in the cylindrical container. In one embodiment, the face has two opposing side edges, a top edge, and a bottom edge spaced from the top edge. The top edge and bottom edge extend between the opposing side edges. The electronic component further includes two sides extending along the depth from the two side edges, a top extending along the depth from the top edge and a bottom extending along the depth from the bottom edge. The support platform has a central opening including opposing support rails engaging the opposing side edges of the face and supporting the electronic component.

The system may further include a plurality of electronic components arranged in the cylindrical container as a stack with the sides of all electronic components aligned. The opposing support rails engage the opposing side edges of all of the faces and support all electronic components. The support platform has cooling element opening positioned between one of the opposing support rails and an interior wall of the cylindrical container, and the cooling element is disposed in the cooling element opening. In one application, the support platform further includes a containment section having a deck, and the central opening and the cooling element opening are disposed in the deck. A lip extends up from the deck in a direction opposite the base around an entire periphery of the deck. The deck and lip direct a flow of second cooling fluid emerging from the face of the electronic component through the cooling element opening and along the cooling element.

In one embodiment, the system for immersion cooling computer system components includes a cylindrical container having a circular cross section, and a cooling element containing a first cooling fluid disposed in the cylindrical container. A volume of a second cooling fluid is disposed in the cylindrical container in contact with the cooling element for exchange of heat between the second cooling fluid and the first cooling fluid. In one embodiment, the second cooling fluid is an immersion cooling fluid. A heat generating electronic component is disposed within the cylindrical container and completely immersed in the second cooling fluid for exchange of heat between the electronic component and the second cooling fluid, and a micropump is disposed in the second cooling fluid and integrated into the heat generating electronic component to direct a flow of the second cooling fluid through the electronic component and over the of cooling element.

In another embodiment, there is a method for immersion cooling electronic components that includes opening a top of a cylindrical barrel containing an immersion cooling fluid, placing a support within the cylindrical barrel, using the support to hold at least one heat generating electronic component in the cylindrical barrel such that the electronic component is completely immersed in the immersion cooling fluid, immersing at least one cooling element in the immersion cooling fluid within the cylindrical barrel adjacent the at least one electronic component, circulating cooling fluid from a source external to the cylindrical barrel through the at least one cooling element, and using at least one micropump integrated into the at least one electronic component and deriving power from the at least one electronic component to direct a flow of the immersion cooling fluid vertically up through the at least one electronic component and vertically down over the at least one cooling element to transfer heat from the at least one electronic component through the immersion cooling fluid and to the cooling fluid from the source external to the cylindrical barrel for removal from the cylindrical barrel.

FIGURES

The accompanying drawings, which are incorporated in and constitute a part of the specifications, illustrate one or more embodiments and, together with the description, explain these embodiments.

DETAILED DESCRIPTION

Figure 1:
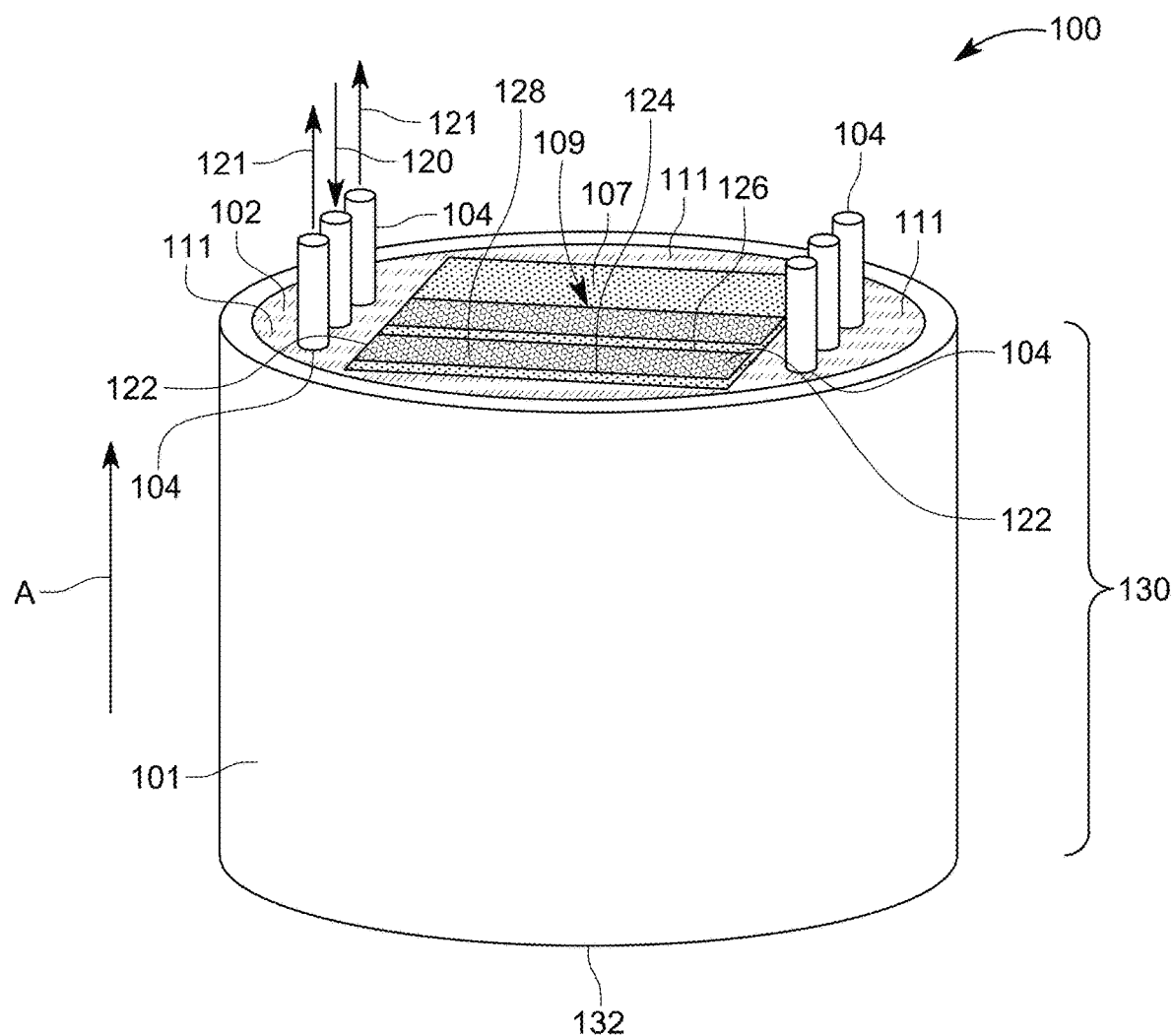
FIG. 1 is an illustration of an embodiment of an electronic component cooling system having a cylindrical container.

The following description of the embodiments refers to the accompanying drawings. The same reference numbers in different drawings identify the same or similar elements. The following detailed description does not limit the invention. Instead, the scope of the invention is defined by the appended claims. In one embodiment, the system is deployed in a standard type of datacenter. In another, less expensive embodiment, the system is deployed in a warehouse or 'pole barn'. In one embodiment, the system is deployed to a field location, for example, inside a shipping container and placed near a source of cooling water, for example seawater or an evaporative pond in desert applications.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Exemplary embodiments of systems and methods provide improvements to electronic component cooling systems configured as immersion cooling systems for heat generating electronic equipment or components including heat generating computing equipment or components. The improved system for immersion cooling of electronic components includes multiple parts that are utilized individually or in combination. These parts include low-cost commodity containers or tanks used for shipping the immersion cooling fluid, transporting the complete system for immersion cooling of electronic components, and operating the computing or information technology (IT) system equipment on site. Suitable heat generating electronic components or computing equipment include, but are not limited to, computers, servers including blade servers or high-density servers, processors, computer storage systems, transformers, and information technology (IT) systems. Suitable tanks or containers including low-cost commodity tanks include, but are not limited to, carboys, plastic water tanks, barrels, drums, horizontal hauling tanks, fiberglass tanks, fuel tanks, pest control operator (PCO) liquid transport tanks, and Intermediate Bulk Container (IBC) tanks including caged IBC tanks. In one embodiment, the tank or container is a cylindrical tank, container, drum or barrel having a circular cross-section. In one embodiment, the tank or container is an open top rectangular tank or container having a lip, ridge or shoulder extending along the open top edge of the tank for supporting electronic components such as servers and cooling components such as liquid-liquid heat exchangers placed into the tank. In another embodiment, the tank or container is a cylindrical tank or container constructed from a cylindrical metal or plastic barrel having a generally circular cross-section. As used herein, container or tank refers to any of these types of containers.

The container is constructed from a material that is compatible with the cooling liquid contained within the container. Suitable materials for the containers include, but are not limited to, plastics, elastomers, metals, fiberglass and combinations thereof. In one embodiment, the containers are high density polyethylene (HDPE) tanks. When conventional cooling liquid storage and delivery tanks, drums or barrels are used, these tanks, drums and barrels are modified, preferably on site, to remove the top of the tanks, drums and barrels to facilitate insertion of the cooling system equipment including the electronic components to be cooled. In one embodiment, these modifications form the cylindrical container having the circular-cross section. While existing systems assume that rectangular shapes are the most efficiently shapes and mimic air racks, using a cylindrical tub or barrel distributes the forces of the liquid immersion fluid evenly, preventing bowing without the use of added structural reinforcements. The cylindrical shape also allows the cooling elements to be positioned and packed close to the heat generating electronic components, which allows high heat densities in a compact an inexpensive configuration. Moreover, these cylindrical barrels exist as a standard product, e.g., a salvage drum.

The electronic component cooling system utilizes two cooling fluids, a first or primary cooling fluid circulated from a source external to the container and a second or secondary cooling fluid. A volume of the second or secondary cooling fluid is disposed in the container, and the second cooling fluid is suitable for immersion of the electronic components and compatible with the operation of the electronic components while immersed, i.e., an immersion cooling fluid. Suitable immersion cooling fluids include, but are not limited to, dielectric fluids such as dielectric oils including mineral oils, silicon oils and vegetable oils. Suitable dielectric immersion oils are known and available in the art. For embodiments utilizing multiple separate containers, each volume of the second cooling fluid is self-contained within a given container, and the first cooling fluid is circulated from a common source and individually through all of the containers.

In one embodiment, the container, i.e., tank, drum or barrel, containing the system for immersion cooling is the container used to store and ship the second cooling fluid. Therefore, the second cooling fluid is shipped to a site in which the system for immersion cooling is to be operated in the container, and the container is modified on site to place the components of the system for immersion cooling of the electronic components in the volume of the second cooling already in the container. The modifications include opening a top of the container, removing a portion of the second cooling fluid as needed to accommodate placement of components within the container, placing components within the container, and making the necessary plumbing, electrical and electronic connections to the components. Alternatively, the container is shipped as an empty container, and the modifications also include filling the container on site with a desired volume of the second cooling fluid.

To provide for the desired cooling of the electronic components immersed in the second cooling fluid, the second cooling fluid is circulated within the container through the heat generating electronic components. Circulation of the immersion cooling fluid occurs within the container, and the second cooling fluid is also circulated over at least one cooling element, e.g., a liquid-liquid heat exchanger, that is also located within the container and immersed in the second cooling fluid. The first or primary cooling fluid, e.g., water, is circulated through the cooling element from a source external to the container, and heat from the second cooling fluid is transferred to the first cooling fluid, which cools the second cooling fluid. The heated first cooling fluid is routed out from the cooling element, removing the heat from the container. In one embodiment, portions of the cooling and circulation system for the first cooling fluid, e.g., the cooling element, plumbing, pumps and insulation are located outside the container, and are configured, for example, using ad-hoc plumbing assembled on site.

The system for immersion cooling includes a support that is placed within the container within the second cooling fluid. The support is configured to hold the heat generating electronic components while immersed in the second cooling fluid. The support also provides for positioning of the cooling element or cooling elements around the electronic components. In one embodiment, the support is shaped to direct the flow of second cooling fluid through the electronic components and over the cooling elements to maximize contact and heat transfer while minimizing an amount of second cooling fluid that bypasses these electronic components and cooling elements. In one embodiment, the support is constructed from one or more commercially available, low cost, lightweight computing equipment racks such as server racks having a plurality of shelves to hold server chassis or other computing equipment. Typically, these shelves are horizontal, running from the front to the back of the computing equipment racks. The racks are arranged with a rack bottom that can carry the weight of all the server chassis. When placed in the container with the immersion cooling fluid, however, the computer equipment racks are placed with the rack back adjacent the bottom of the container and the shelves in a vertical orientation. Therefore, the rack back of the computing equipment rack functions as a base of the support and is carrying the weight of the electronic components. In one embodiment, structural improvements are made to each computing equipment rack to facilitate carrying weight by the rack back and to accommodate forces applied to the computing equipment rack during shipping and field deployment of the system for immersion cooling of electronic components. Suitable structural improvements include, but are not limited to, additional welds or fasteners at the points of contact between the rack shelves and the computing system rack frame and addition structural members including single force and two force members and cross members. Suitable server racks are described, for example, in U.S. Pat. No. 10,349,555, the entire disclosure of which is incorporated herein by reference.

In one embodiment, the support includes a support platform spaced from the bottom of the container along a height of the container. The support platform is spaced a distance that is sufficient to accommodate the electronic components supported from the supported platform. In one embodiment, the support includes support structures extending from the support platform and forming a base of the support that contacts the bottom of the container. Alternatively, the support platform hangs from a top edge of the container around the open top of the container. In one embodiment, the support platform is secured to the interior walls of the container at the desired height.

In one embodiment, the support platform includes a containment section. The containment section includes a deck with a central opening to accommodate placement of the electronic components. In one embodiment, the support platform includes opposing, parallel support rails spaced apart from each other along the central opening. The opposing support rails support the electronic components, for example, by engaging the opposing side edges of the faces of the electronic components. The containment section also includes at least one or two or more cooling element openings. In one embodiment, each cooling element opening is positioned between the central opening and an interior wall of the container. For example, each cooling element opening is positioned between one of the opposing support rails and the interior wall of the container. In one embodiment, the containment section includes two cooling element openings that are arranged on diametrically opposed sides of the central opening and therefore of the plurality of electronic components contained in the central opening. Each cooling element opening accommodates one or more cooling elements.

The containment section includes a lip extending up from the deck in a direction opposite the base of the support or the bottom of the container. The lip extends from the deck a sufficient distance to be above a level of the second cooling fluid in the tank, for example, when the system for cooling electronic equipment is at rest and not operating. The lip extends around the entire periphery of the deck. Therefore, the deck and lip contain the second cooling fluid and direct a flow of the second cooling fluid emerging from the tops or faces of the electronic components back down through the cooling element openings and along the cooling elements. The containment system, which includes the deck and the lip, holds the heated secondary cooling fluid at the top and forces the heat second cooling fluid back down through the cooling elements by gravity without the need for any additional equipment to move the heated cooling fluid, e.g., additional pumps. This reduces maintenance requirements and costs. Exemplary embodiments utilize three-dimensional (3D) printing capabilities to configured and produce a containment system capable of guiding the flow of heated second cooling fluid with great precision and efficiency.

In one embodiment, within each container or tank and immersed in the second cooling fluid is a manifold system for holding the computing system components. The manifold system rests on or toward the bottom of the container, and the individual electronic components are placed within slots in the manifold system. The manifold system directs a flow of immersion cooling fluid through the heat generating computing system components. Exemplary manifold systems are described in U.S. Pat. No. 10,257,963, the entire disclosure of which is incorporated herein by reference.

The system for immersion cooling of electronic components also includes one or more cooling elements or heat exchangers, e.g., liquid-liquid heat exchangers disposed within the container to provide for cooling of the second cooling fluid. In one embodiment, the system for immersion cooling includes two cooling elements. Suitable cooling elements include, but are not limited to, modular liquid-liquid heat exchangers, cooling pipes, cooling plates, and tube and fin heat exchangers constructed, for example, from metals such as copper and aluminum. Each cooling element can be placed in the tank separate from the electronic components to be cooled. For a cylindrical tank, barrel or drum, the electronic components are located generally in the center of the cylinder, and the cooling elements are located toward the outer circumference or interior wall of the cylinder. In one embodiment, the cooling elements are attached to and supported by the support. In one embodiment, the cooling elements are attached directly to the electronic component holders or racks, for example, using the rack shelves. In one embodiment, each cooling element is placed and held within the cooling element opening of the containment section, which extends down from the deck toward the bottom of the container. Therefore, the cooling elements are easily inserted into and removed from the container, providing modularity in the arrangement of electronic components to be cooled and cooling elements. In one embodiment, the type, number, size and location of the cooling elements are selected based upon the cooling requirements of the immersed, heat generating electronic equipment to be cooled.

Routed through each cooling element is the first cooling fluid, e.g., water including water derived from well water and surface water sources available on site, that is used to cool the immersion cooling fluid and that is routed to each container individually. This eliminates the need for external hoses, pumps and heat exchangers for the second cooling fluid. In one embodiment, piping for providing the first cooling fluid to the cooling element is routed into the container through the open top of the container. In one embodiment, this piping is provided in the form of a manifold system. When the system includes multiple containers, the arrangement of each container is configured to match with the manifold system, which facilities the insertion or removal of containers and tanks from the system as desired for maintenance or in response to increases or decreases in cooling and computing capacity.

In one embodiment, circulation of the second cooling fluid within each container and through the electronic components is provided by pumps, for example, micropumps disposed within the second cooling fluid. In one embodiment, the pumps are fans provided in commercially available computing system equipment. Alternatively, small pumps available from marine and oil pumping applications can be incorporated into the electronic components, e.g., to replace the fans. In general, the size, number, position and arrangement of the pumps are selected based on the load on the electronic components. These pumps run at the available DC current, e.g., 12 VDC, utilized by and available within the electronic components. In one embodiment, the pump is a miniature or micro brushless DC water pump. These micro water pumps are used in applications such as fountains, pet water supply, and aquarium equipment. In one embodiment a mini DC12V Brushless Pump AD20P-1230A, 4.8 W, IP68, Hmax 300CM and Qmax 240 L/H is used. In one embodiment, the micro pump has a length of 54.4 mm, a width of 52 mm and a height of 40.8 mm. In one embodiment, the inlet and outlet diameters of the micro pump are 8.5 mm. In one embodiment, the micro pumps are incorporated into the electronic components to be cooled and are powered by the power supplied to the electronic components. For example, the micro pumps are embedded into computing system equipment, e.g., the servers, that are being cooled.

The use of micro pumps located within and powered by the electronic components allows for a precise delivery of the second cooling fluid inside the electronic components. The micro pumps are installed to create a flow from the bottom to the top of each electronic component. In one embodiment, ad-hoc baffles and sealing plates are included to improve the desired flow of the second cooling fluid. Exemplary embodiments allow for redundancy at the level of each electronic component. In addition, powering the micro pumps using the electronic components simplifies the construction and eliminates the need for additional power circuits and equipment. The use of the integrated micropumps provides redundancy at the electronic component level, is less expensive, and yields a simpler configuration that can be customized for a given application with a higher degree of precision.

Referring initially to FIG. 1, an exemplary embodiment of an electronic component cooling system 100 is illustrated. As illustrated, the electronic component cooling system includes a single container 101, and the single container is a cylindrical container 101. In one embodiment, the cylindrical container is a tank, barrel or drum or a portion of a tank, barrel or drum in for shipping and storing an immersion cooling fluid. For example, the cylindrical container is a metal or plastic drum with the top removed. Suitable cylindrical tanks include, but are not limited to, the 110 Gallon Steel Salvage Drum, Cover with Bolt Ring Closure, commercially available as part no. 26BSVO from the Cary Company of Addison, Illinois. In general, the cylindrical container, or any tub, tank or container described herein is completely passive and has no moving parts associated with the tub, tank or container. Using a cylindrical container having a circular cross-section resolves the structural issues associated with rectangular tubs containing a volume of liquid, e.g., bowing, and eliminates the need for additional reinforcing members to correct these structural issues or for the use of more expensive reinforced tanks such intermediate bulk containers having a pallet base and metal frame or metal cage. The cylindrical shape supports the forces from the components and immersion cooling fluid without the need for external supports.

In addition, the cylindrical shape with circular cross-section facilitates the placement of the electronic components and associated supports, which is arranged in a generally rectangular shape, in the middle of the cylindrical container while locating the cooling elements, e.g., the heat exchangers through which the first cooling fluid flows, around the electronic components and generally to the side or around the circumference of the cylindrical container. This arrangement facilitates the desired extreme densities of electronic components within the cylindrical container even with the unusual shape of that container.

The cylindrical container includes a volume of the second cooling fluid 102. Suitable secondary cooling fluids are discussed herein. In one embodiment, the second cooling fluid is a dielectric liquid such as, but not limited to, mineral oil, a gas, or combinations thereof in a stable or phase transition state.

The electronic component cooling system includes two cooling elements disposed within the cylindrical tank and one or more pipes 104 that provide for the flow of the first cooling fluid into 120 and out of 121 the cooling element within the cylindrical container so that the first cooling fluid is circulated through each cooling element, for example, in a closed loop, from a cooling fluid source external to the cylindrical container. As illustrated, the cooling elements are disposed within the cylindrical container and completely immersed in the second cooling fluid. In one embodiment, each cooling element is at least partially immersed in the second cooling fluid. In one embodiment, the first cooling fluid circulates inside and is fully contained within the cooling elements. Suitable cooling elements include, but are not limited to, arrangements of the liquid-liquid heat exchangers as discussed herein. In one embodiment, the cooling pipes 104 are hollow systems, e.g., tubes or pipes, containing the first cooling fluid, e.g., chilled water.

In one embodiment, the system for cooling electronic components provides both enhanced flow of the second cooling fluid around the cooling elements and enhanced transfer of heat between the first and second cooling fluids. Suitable cooling elements include, but are not limited to, liquid-liquid cooling elements, radiators, cooling plates, tubes, finned in line cooling systems, and any other geometry adapted for the exchange of heat between the second cooling fluid and the first cooling fluid in the cylindrical container. The number, geometry and type of cooling elements is adapted to the amount of heat to be removed from the electronic components. In one embodiment the flow of first cooling fluid in the cooling elements is controlled depending on the thermal load, input/output temperatures and other parameters.

In one embodiment, the central area 107 of the cylindrical container includes the heat generating electronic components 109 to be cooled. In one embodiment, the central area is a square or rectangular area, however, the central region can be other shapes. In addition, the central area is spaced from the interior walls of the cylindrical container, defining regions or spaces 111 around the central area. In one embodiment, the corners of the square central area touch or are adjacent to the interior wall of the cylindrical container. The cooling elements are contained in the spaces around the central area. Therefore, in one embodiment the cooling elements are disposed between the electronic components and the interior wall of the cylindrical container. In one embodiment, each electronic component has a face 128 disposed toward the top of the cylindrical container and accessible through the open top of the cylindrical container. The face includes the electrical, power, and communication connections for the electronic component. In one embodiment, the electronic component, including the face is disposed below a level of the second cooling fluid in the cylindrical container. Therefore, the electronic component is completely immersed in the second cooling fluid.

In one embodiment, face is rectangular or square and includes two opposing side edges 122, a top edge 124, and a bottom edge 126 spaced from the top edge. The top edge and bottom edge extend between the opposing side edges to define the rectangular face. The electronic component has two sides extending from the two side edges along the depth of the electronic component, which extends vertically in the cylindrical container along a height 130 of the cylindrical container. In addition, the electronic component includes a top extending along the depth from the top edge and a bottom extending along the depth from the bottom edge. In this embodiment, the electronic component has the form of a blade server. As illustrated, the system for cooling electronic components includes two cooling elements, and the cooling elements are disposed on diametrically opposed sides of the electronic component. In one embodiment, each cooling element is disposed between one of the opposing edges and therefore one of the side of the electronic component and the interior surface of the cylindrical container.

In one embodiment, a plurality of electronic components is disposed in the central area. The plurality of electronic components is arranged in the cylindrical container as a stack with the sides of all electronic components aligned. In additional the top and bottom of adjacent electronic components are spaced form each other. In one embodiment, this spacing is just sufficient to allow for the insertion and removal of the electronic components but not enough to permit the circulation of the second cooling fluid to bypass the electronic components. Therefore, the second cooling fluid is routed through each electronic component. In one embodiment, the spaces or separations in the central area control the flow of the second cooling fluid vertically up through the cylindrical container in the direction of arrow A and through each electronic component. The second cooling fluid passes over the faces of the electronic component toward the inner walls of the cylindrical container and then down toward the bottom 132 of the cylindrical container past and over each cooling element. In one embodiment, the second cooling fluid flows by gravity down and over each cooling element.

The central area 107 containing the electronic systems also contains structures to support the electronic components to be cooled. Suitable support structures are discussed herein. In one embodiment, the central area includes ledges or rails to support each electronic component, for example, along the side edges, top edge or bottom edge of the face. The support structures can be independent, stand-alone structures or frames placed into the cylindrical container, or can be structures formed integral with the cylindrical container. In one embodiment, the support structures engage or rest on the bottom of the cylindrical container. Alternatively, the support structures engage a top rim of the open end of the cylindrical container in a hanging arrangement.

In one embodiment, the electronic components to be cooled are servers or blade servers. Suitable servers include servers having dimensions of 1 rack unit (RU) or multiple rack units. Preferably, the electronic components are configured as micro cells. These micro cells have a smaller size or form factor that provides for very high densities of electronic components or computer equipment and computing capacity within a given cylindrical container. In one embodiment, the micro cells are sized to facilitate up to about 12 computing nodes in a given cylindrical container. As used herein, computing nodes or electronic components refer to a collection of electronic and computing equipment for which the size is optimized for use in the container or tub, for example, a server or server rack. In one embodiment, given the smaller size of these micro cells, circulation of the second cooling fluid is provided by or at least enhanced by the micro pumps that are incorporated directly into each micro cell.

In one embodiment, the cylindrical container 101 includes a lid. Alternatively, the circular container is not sealed by a lid, allowing for the passage of cooling pipes to the cooling elements and power lines and network communication lines to the computing equipment.

In operation, the second cooling fluid in the cylindrical container is an immersion fluid or liquid, and the heat generating electronic components are immersed in the second cooling fluid. This heats the second cooling fluid and pulls the second cooling fluid from the bottom of the cylindrical container through the electronic components using the natural convective flow of the heated second cooling fluid. In one embodiment, fluid circulating devices such as mechanical fluid circulating devices, fans or pumps, for example fans or pumps mechanically integrated into and powered by the electronic components, e.g., micro-pumps, are used to enhance the natural convective flow of the heated second cooling fluid. Alternatively, the fluid circulating devices are sufficient alone to provide the desired circulation of the second cooling fluid. In one embodiment, the fluid circulating devices are separate from or independent of the electronic components. The flow of the second cooling fluid moves vertically through each electronic component and emerges from the face of each electronic component toward the top of the cylindrical container. The second cooling fluid then flows back to the bottom of the cylindrical container through the spaces around the central area containing the cooling elements. The second cooling fluid exchanges heat with the cooling elements as is moves through these spaces.

In one embodiment, the second cooling fluid is a gas, and the circulation of the second cooling fluid is reversed. The fluid circulating devices pull the gas from the top to bottom of the cylindrical container through the electronic components, heating the second cooling fluid. The heated second cooling fluid flows back to the top through the side spaces containing the cooling elements.

The cylindrical container with circular cross-section is a significant improvement over existing containers and tanks in that it ensures that the container wall pressure from the second cooling fluid, when a liquid, is uniform, avoiding the need for bracing or excessive wall thickness to preserve the shape of the container. Furthermore, a cylindrical container with circular cross-section enables a high ratio of cooling elements to electronic components with a minimum of distance between the cooling elements and electronic elements and reduces the volume of second cooling fluid required in the cylindrical container while allowing for extremely dense heat loads.

Figure 2:
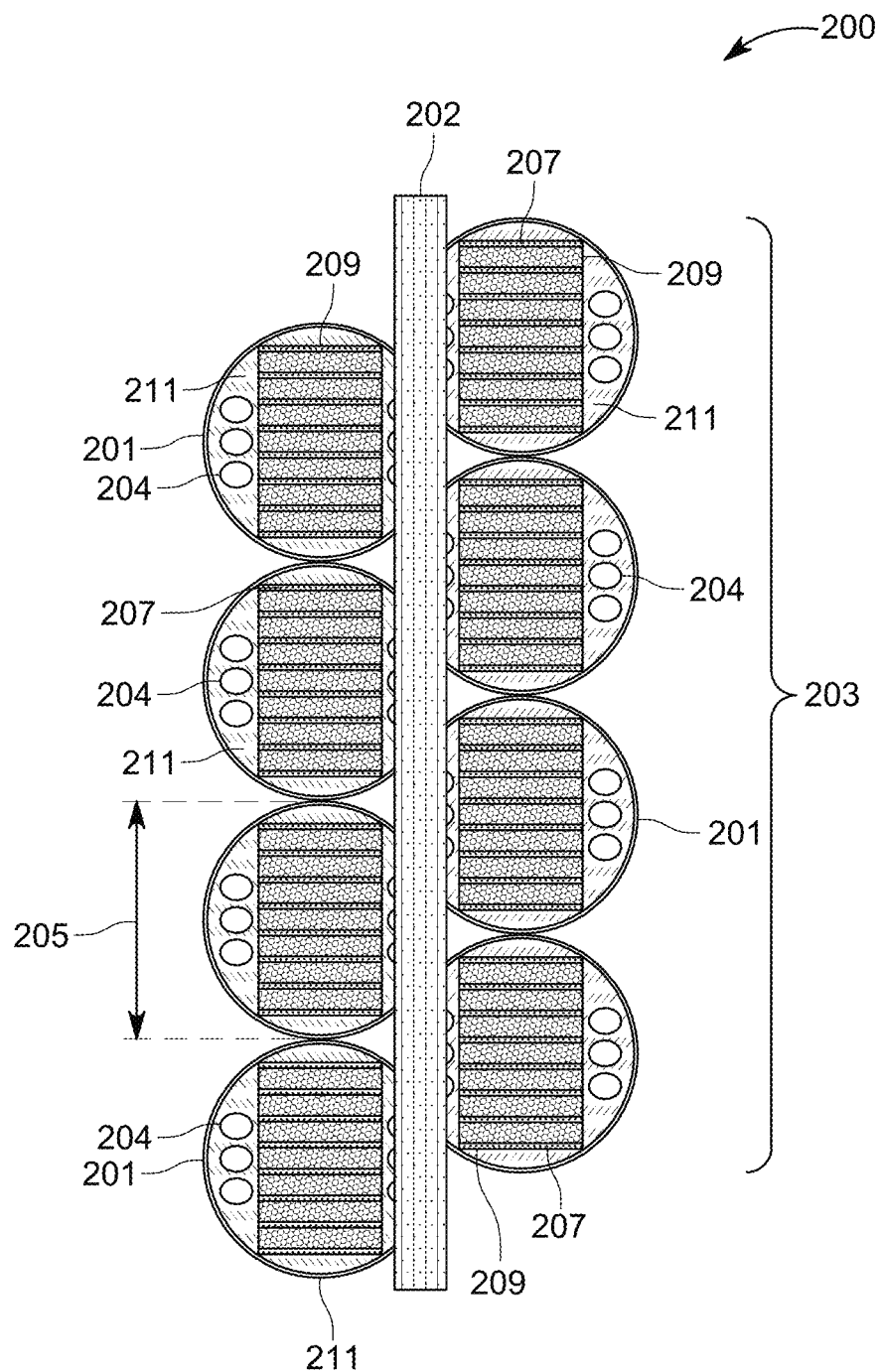
FIG. 2 is an illustration of an embodiment of an electronic component cooling system containing a plurality of cylindrical containers manifolded together.

When the number of heat generating electronic components or computing systems to be cooled is greater than the number that can be accommodated in a single container, multiple containers are used. Referring now to FIG. 2, an embodiment of a system for cooling electronic components 200 that utilizes at plurality of containers, for example, a plurality of cylindrical containers 201 is illustrated. The geometry of cylindrical container provides for modularity in building a computing facility utilizing a plurality of systems for cooling electronic components to a desired scale and having a variable ratio of cooling elements to electronic components or servers. In one embodiment, the plurality of containers is arranged in one or more rows 203. As illustrated, the cooling system includes two rows, with each row containing four cylindrical containers. However, the cooling system can include one, two, three or more rows, and each row can contain, two, three or more cylindrical containers. In addition, each row can have the same number of cylindrical containers or a different number of cylindrical containers.

In addition, each cylindrical container is a self-contained system for cooling electronic components and includes all of the elements of the system including the volume of second cooling fluid 211, the electronic components 209 in the central area 207 and the cooling elements or pipes 204 connected to the cooling elements. While illustrated as identical, in one embodiment, the configuration of the elements among the cylindrical containers varies.

The shape of the cylindrical containers facilitates a tighter packing density of cylindrical contains between adjacent rows. In one embodiment, each row is shifted from an adjacent row by up to one half the diameter 205 of the circular cross section of the cylindrical center. Therefore, cylindrical containers in adjacent rows partially overlap. This facilitates packing together the cylindrical containers and the alignment of power, communication and first cooling fluid plumbing connection to service the cylindrical containers in adjacent rows. Using an identical or complimentary arrangement of cooling elements and computer systems in each cylindrical container enhances the ability to align the power, communication and plumbing connections among the cylindrical containers. With the power, communication or networking, and fluid connections aligned, a common manifold system 202 containing the corresponding external power, communication and plumbing connections is positioned and used between each pair of adjacent rows. This common manifold system allows for removing and adding cylindrical containers as needed and provides a very dense environment that fully leverages the configuration of the cylindrical containers. In one embodiment, multiple common manifold systems are used system containing multiple cylindrical containers to provide for more than two rows of cylindrical containers.

Figure 3:
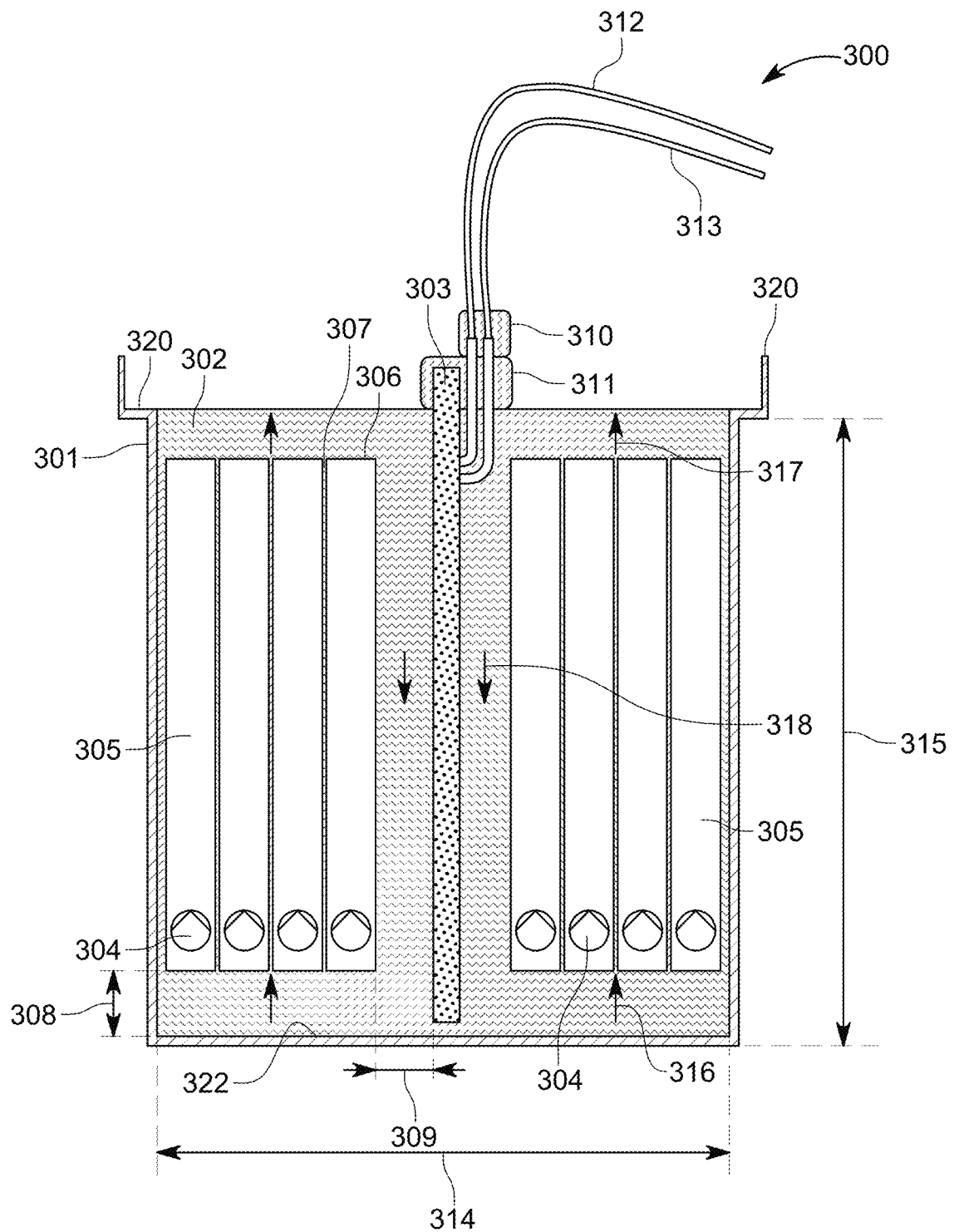
FIG. 3 is an illustration of a side cutout view of an embodiment of a system for immersion cooling of electronic systems.

Referring now to FIG. 3, another exemplary embodiment of a system for cooling electronic components 300 having a container 301 is illustrated. Preferably, the container does not contain any moving parts and fully contains the second cooling fluid, making for a cost efficient and resilient configuration, i.e., the cooling elements and electronic components into which active components are integrated are not a part of the container itself but are placed into container. In one embodiment, the container is constructed from a single layer of material. Alternatively, the container is constructed with a double skin or is placed inside a second container of slightly larger dimensions to add an additional level of security against rupture of the first interior container. The container is manufactured using a material that does not react to the type of second cooling liquid used in the temperature range of the application. In one embodiment, the container is a single polyethylene, HDPE or LDPE, open top container having a rectangular cross-section with a 2 inch by 2 inch ledge 320 extending along at least two opposing sides at the top.

The system for cooling electronic components includes, within the container, a volume of the second cooling fluid 302, at least one cooling element 303, e.g., a cooling plate, one or more electronic components 305 immersed in second cooling fluid, and one or more fluid circulating devices 304. In one embodiment, each fluid circulating device is integrated into one of the electronic components 305 in the container. Therefore, each fluid circulating device is also disposed in the second cooling fluid. Suitable circulating devices include the fans and pumps, and micro pumps as discussed herein. In one embodiment, each electronic component is a micro cell.

Suitable second cooling fluids are immersion cooling fluids and include, but not limited to, mineral oil, vegetable oil such as rapeseed oil, and Fluorocarbons. In one embodiment, the second cooling fluid is a nontoxic dielectric chemical, stable as a liquid in the temperature range required to cool the electronic components, nonvolatile and completely contained in the container.

In one embodiment, the electronic components and cooling elements extend vertically into the container and are set parallel to each other with their longest dimension, e.g., the depth of the electronic component, extending between the top 320 and the bottom 322 of the container. The shorter dimensions of the electronic components and cooling elements extend horizontally across the container. In one embodiment, each electronic component is enclosed in a chassis 306 or built around a frame sufficiently rigid to allow for proper removal and positioning of the electronic component within the container. The chassis or frame supports all of the elements of the electronic component, including the on-board fluid circulating devices and any additional hardware. The electronic components are positioned as close to each other as possible to avoid fluid movement between adjacent electronic components. In one embodiment, a gap 307 sufficient enough to allow for the separate insertion and removal of each electronic component by sliding the electronic component into and out of the container vertically through the open top of the container is maintained between adjacent electronic components.

Figure 4:
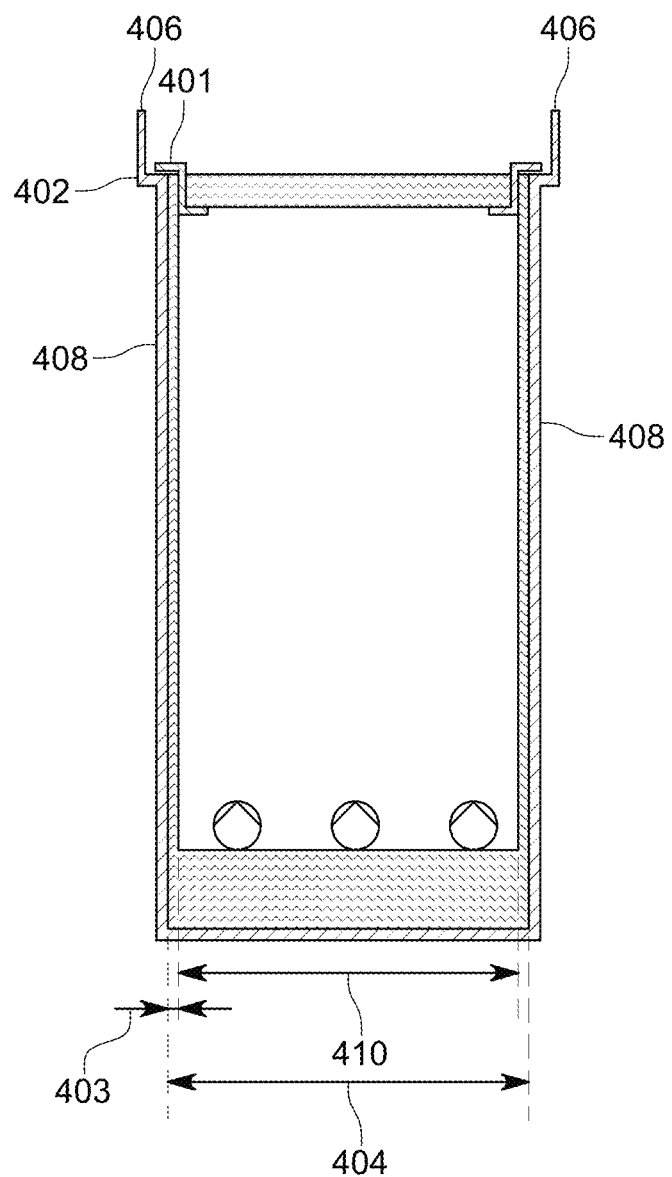
FIG. 4 is an illustration of a side cutout view of an embodiment of the position and positioning system for the electronic systems.
Figure 5:
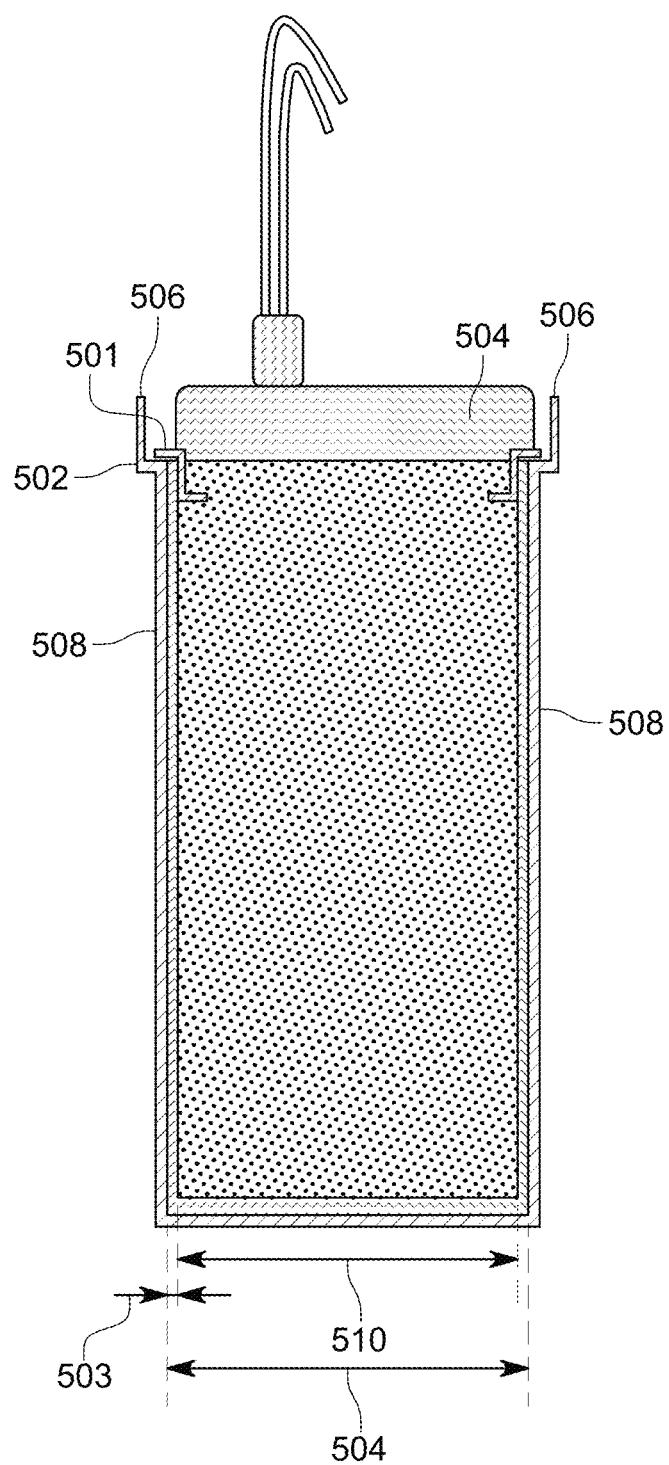
FIG. 5 is an illustration of a side cutout view of an embodiment of the position and positioning system for the cooling plates.

In one embodiment, the electronic components are held in the tub in a position above the bottom of the tub 322 that provides and preserves sufficient space 308 below the electronic components for second cooling fluid flow while ensuring that the tops or faces of the electronic components are submerged in the second cooling fluid. Referring to FIG. 4, in one embodiment, the container is configured with a ledge or rail 402 to support or hang the electronic components. In one embodiment, the ledge or rail is integral with the container and formed into the top edge 406 on opposing sides 408 of the container. Alternatively, the ledge or rail is included in a separate support structure placed inside the container. In one embodiment, angle brackets 401 are attached to top sides each electronic component or chassis of the electronic component. Referring now to FIG. 5, similarly the container is configured with a ledge or rail 502 to support or hang the cooling elements 504. In one embodiment, the ledge or rail is integral with the container and formed into the top edge 506 on opposing sides 508 of the container. In one embodiment, angle brackets 501 are attached to top sides each cooling element. The angle brackets engage the ledge or rail and are supported by the ledge or rail to keep the electronic components and cooling elements properly positioned within the container.

Returning to FIG. 3, each cooling element 303 is positioned between adjacent electronic component. A gap 309 exists between each cooling element and the electronic components on one or both sides of the cooling element to allow for the flow of the second cooling liquid. The cooling elements are held in position within the container so that the desired, pre-determined gap 309 between the cooling elements and the closest electronic component 305 is maintained. In one embodiment, the distance that each cooling element extends into the container towards the bottom of the container, or upwards towards the top of the container is adjusted to improve or increase heat transfer between the second cooling fluid and the first cooling fluid and therefore cooling of the second cooling fluid. In one embodiment, portions of the cooling element and the piping attached to the inlet and outlet of the cooling element extending above the level of the second cooling fluid are covered in insulating material (310, 311) to avoid moisture condensation dripping into the tub. Suitable insulating material includes, but is not limited to, foam or foam rubber insulation.

In one embodiment, the cooling elements 303 are hollow vessels, configured to hold the first cooling fluid and to provide for the circulation of the first cooling fluid through the cooling element to allow heat transfer between the second cooling fluid on exterior of the cooling element and the first cooling liquid circulating in the hollow interior. The hollow interior of the cooling element is fully sealed except for two connection or pipes, an input pipe or inlet 312 for introducing the first cooling fluid into the cooling element from a source external to the container and an output pipe or outlet 313, separate from the inlet, for removing heated first cooling fluid from the cooling element and the container. In one embodiment, the number and position of the cooling elements within the container is a function of the generated heat to be removed. In one embodiment, the generated heat varies during operation of the system for cooling electronic components as the characteristics of the electronic components evolve over time.

In one embodiment, the container is configured such that a first interior horizontal dimensions 404 (FIG. 4), 504 (FIG. 5) is as large as the horizontal dimensional of the electronic components 410 (FIG. 4) and cooling elements 510 (FIG. 5), plus a gap 403 (FIG. 4), 503 (FIG. 5). The gap is selected to be sufficient enough to allow for an easy removal if the electronic components and cooling elements from the container by sliding them vertically out the open top of the container while minimizing flow of the second cooling fluid around the electronic components and cooling elements.

In one embodiment, the container is configured such that a second interior horizontal dimension 314, which is perpendicular to the first interior horizontal dimension, is the sum of all the dimensions of the electronic components and cooling elements extending along the second interior horizontal dimension plus a plurality of gaps 307 just sufficient to allow for an easy removal of the electronic systems and the desired gaps 309 between the cooling elements and the electronic components. In one embodiment, the container is configured such that the vertical dimension 315 is sufficient to provide for a space 308 below the bottom of the electronic components to allow for the circulation of the second cooling fluid when the electronic components are completely immersed in the second cooling fluid.

In one embodiment, the fluid circulating devices 304 are on-board fluid circulating devices that circulate the second cooling fluid vertically upwards through the electronic components. Suitable circulating devices include, but not limited to, micro pumps, fans, valves, bubble generators, and oscillating mechanisms. In one embodiment, the on-board fluid circulating devices are positioned anywhere inside or outside the electronic component or chassis of the electronic component. Regardless of the position of the fluid circulating devices on the electronic components, the fluid circulating devices do not inhibit or prevent the vertical movement, i.e., insertion and removal of the electronic components from the container. In one embodiment, the fluid circulating devices include baffles, pipes, obstructions, guides, nozzles, conduits or any elements or geometry capable of channeling the second cooling fluid to specific areas or regions of the electronic components. In one embodiment, a control system is provided in communication with the circulating devices.

In one embodiment, the system for cooling electronic components includes at least one control system in communication with each fluid circulating device. In one embodiment, the control system is located external to the container. Alternatively, the control system is contained within the electronic component. The control system is configured to change the flow rate or direction of flow of the second cooling fluid depending on parameters including, but not limited to, temperature, power usage, and software or firmware induced conditions in the electronic components or external systems. In one embodiment, the electronic component is a server, and a microcontroller and the firmware in the server controls the flow rate and direction of cooling fluid flows by controlling the rotational speed and direction of the micropumps based on a fan curve. These control systems can be used with any embodiment discussed herein. For each electronic component, the on-board fluid circulating device creates a flow 316 of second cooling fluid that enters the bottom of the electronic component and exits 317 the top or face of the electronic component. In one embodiment, the number and type of fluid circulating devices for each electronic components and within the entire system for cooling an electronic component are varied as a function of conditions including the heat load to removed or the level of redundancy required.

In operation, the second cooling fluid moves vertically through the electronic components from the bottom to the top of the container under the force of at least one of convection heat and fluid circulating devices. In one embodiment, the second cooling fluid emerging from the face of the electronic components naturally returns along a flow path 318 from the top to the bottom of the container through the gap 309 alongside one or both sides of the cooling elements. The second cooling fluid heats up while passing through the electronic components and cools down as it flows along and potentially through the cooling elements. In one embodiment, the flow induced by the fluid circulating devices works in conjunction with the natural convection movement of the second cooling fluid, improving the operational efficiency of the system for cooling the electronic components.

In operation, flexibility in the number of cooling elements inserted in the container allows the system for cooling electronic components to be tuned for maximum efficiency. In one embodiment, the number of cooling elements is easily evolved and changed with the nature and heat load of the electronic components, extending the efficiency and serviceable life of the system for cooling electronic components. In operation, a wide range of redundancy levels can be achieved for each tub independently by adding cooling plates in any given tub in excess of the actual number required to cool the electronic or computing systems in that tub. In one embodiment, the cooling elements are connected to multiple independent external cooling circuits to provide an additional level of redundancy such that the loss or scheduled maintenance of one or more external cooling circuits does not affect the operation of the system for cooling electronic components.

In one embodiment, flexibility in the number of fluid circulating devices provides granularity in the tuning of the system for cooling electronic components for maximum efficiency at the level of individual electronic components. In operation, since each electronic component includes separate and independent integrated fluid circulating devices, each electronic component can be removed from the container for maintenance separately and independently of any other electronic component, reducing the impact of a failure in an individual electronic component or fluid circulating device of that electronic component to that individual electronic component. In one embodiment, since each electronic component includes its own integrated fluid circulating devices, the cooling effort of each electronic component is modulated or shutdown separately or independently of the other electronic components. In one embodiment, the cooling effort of multiple electronic components is controlled together. This allows for a very granular tuning of the energy used to cool the electronic components. Taken together, the operational considerations of the system for cooling electronic components provide superior levels of efficiency, reliability and operational simplicity when compared to conventional liquid immersion cooling systems.

Figure 6:
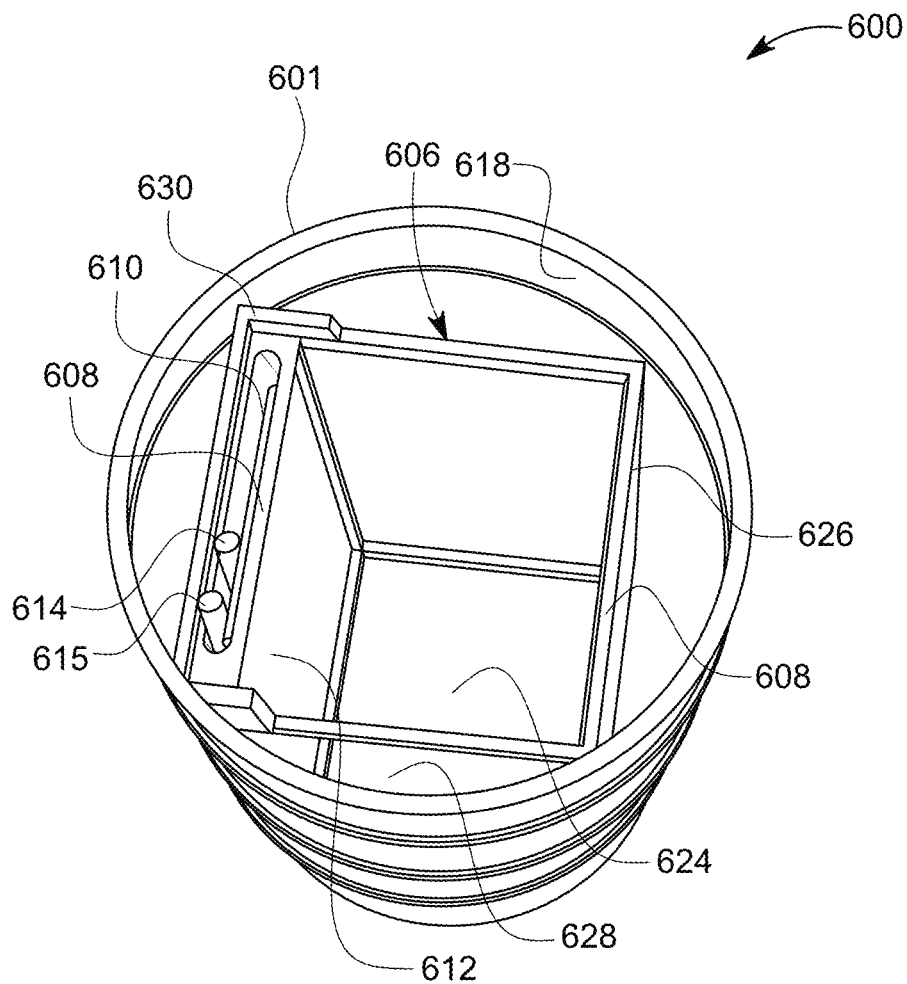
FIG. 6 is an illustration of an embodiment of a cylindrical barrel containing components of an electronic component cooling system.

Referring now to FIG. 6, an embodiment of a container and support for use in the system for cooling electronic components is illustrated. The container is a cylindrical container 600 having a circular cross section. In one embodiment, the cylindrical container is a metal barrel, for example, the metal barrel used to store and ship the second cooling fluid. The cylindrical container has an open top 601 that provides for insertion of the additional elements of the system for cooling electronic components. In one embodiment, the open top is the top of the metal barrel with the lid removed, for example by opening the fasteners holding the lid onto the metal barrel. Alternatively, only a portion of the length or height of the metal barrel is used. For example, the open top is created by removing or cutting a top portion of the barrel around a circumference of the barrel. In one embodiment, the barrel is cut at a desired height; therefore, only a portion of the barrel is used for the system for cooling electronic components.

Figure 7:
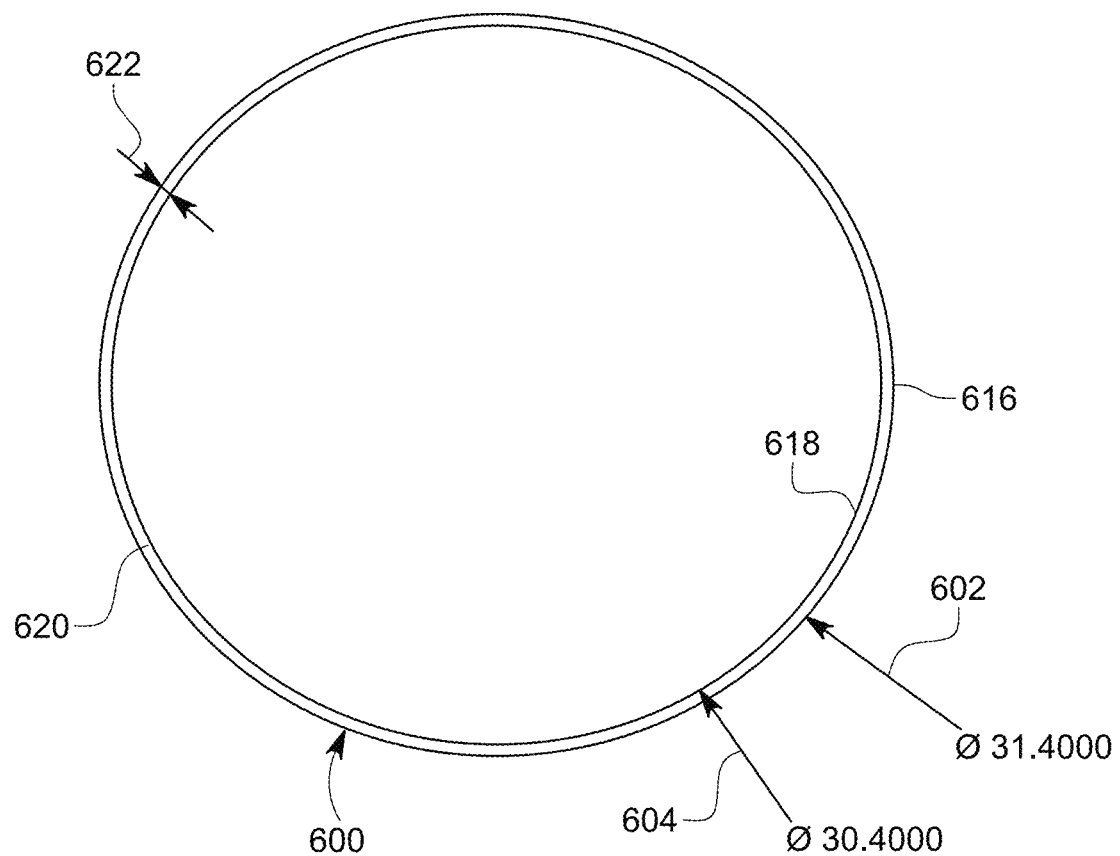
FIG. 7 is a plan view from the top of a cylindrical barrel.

Referring to FIG. 7, in one embodiment, the cylindrical wall 620 of the cylindrical container 600 has an exterior wall surface 616 at an outer diameter 602 of about 31 inches or 31.4 inches and an interior wall surface 618 at an inner diameter 604 of about 30 inches or 30.4 inches. In addition, the tank can have an inside height or depth of about 40.8 inches and an outside height of about 42.5 inches. In one embodiment, the tank is a carbon steel tank made of 16 gauge steel having a wall thickness 622 of about 1.5 inches.

Returning to FIG. 6, with the top of the tank removed, and at least one support 606 is placed through the open top and into the cylindrical container. The support is placed into the cylindrical container such that the support rests on the bottom 628 of the cylindrical container and is completely contained within the inside height of the tank. In one embodiment, the support is a server rack. Suitable server racks are known and available in the art. In one embodiment, the support includes a support platform 626 spaced from a bottom of the cylindrical container along a height of the cylindrical container a distance at least equal to the depth or length of elements held within the support. The support platform is arranged to hold the electronic components and cooling elements in the cylindrical container with the depth or length of those elements positioned vertically in the cylindrical container.

The support platform includes a central opening 624 disposed the central area of the cylindrical container. In one embodiment, the central opening includes opposing support rails 608 to support or hang the electronic components, for example, by engaging the side edges of the face of each electronic component. The support platform includes at least one cooling element opening 610 positioned between one of the opposing support rails and the interior wall surface 618 of the cylindrical container. In one embodiment, the support includes one cooling element opening. In one embodiment, the support platform includes two or more cooling element openings, each disposed between the one of the opposing support rails and the interior wall surface of the cylindrical container. At least one cooling element 612 is disposed in the cooling element opening. The cooling element extends vertically into the cylindrical container and is positioned between the side, top or bottom of each electronic component disposed in the support. The cooling element includes an inlet 614 for introducing the first cooling fluid into the cooling element from a source external to the cylindrical container and an outlet 615, separate from the inlet, for removing heated first cooling fluid from the cooling element. The inlet and the outlet are accessible through the open top of the cylindrical container.

In one embodiment, the support platform includes a lip 630 extending up from the support platform in a direction opposite the base of the support platform and the bottom of the cylindrical container. In one embodiment, the lip extends around the periphery of the deck at least in the area of the cooling element opening. Alternatively, the lip extends around an entire periphery of the support platform. The lip extends up from the support platform a sufficient distance to be above the fill level of the second cooling fluid when the system for cooling electronic components is at rest. The lip and deck direct the flow of second cooling fluid emerging from the face of top of each electronic component through the cooling element opening and along the cooling element.

Figure 8:
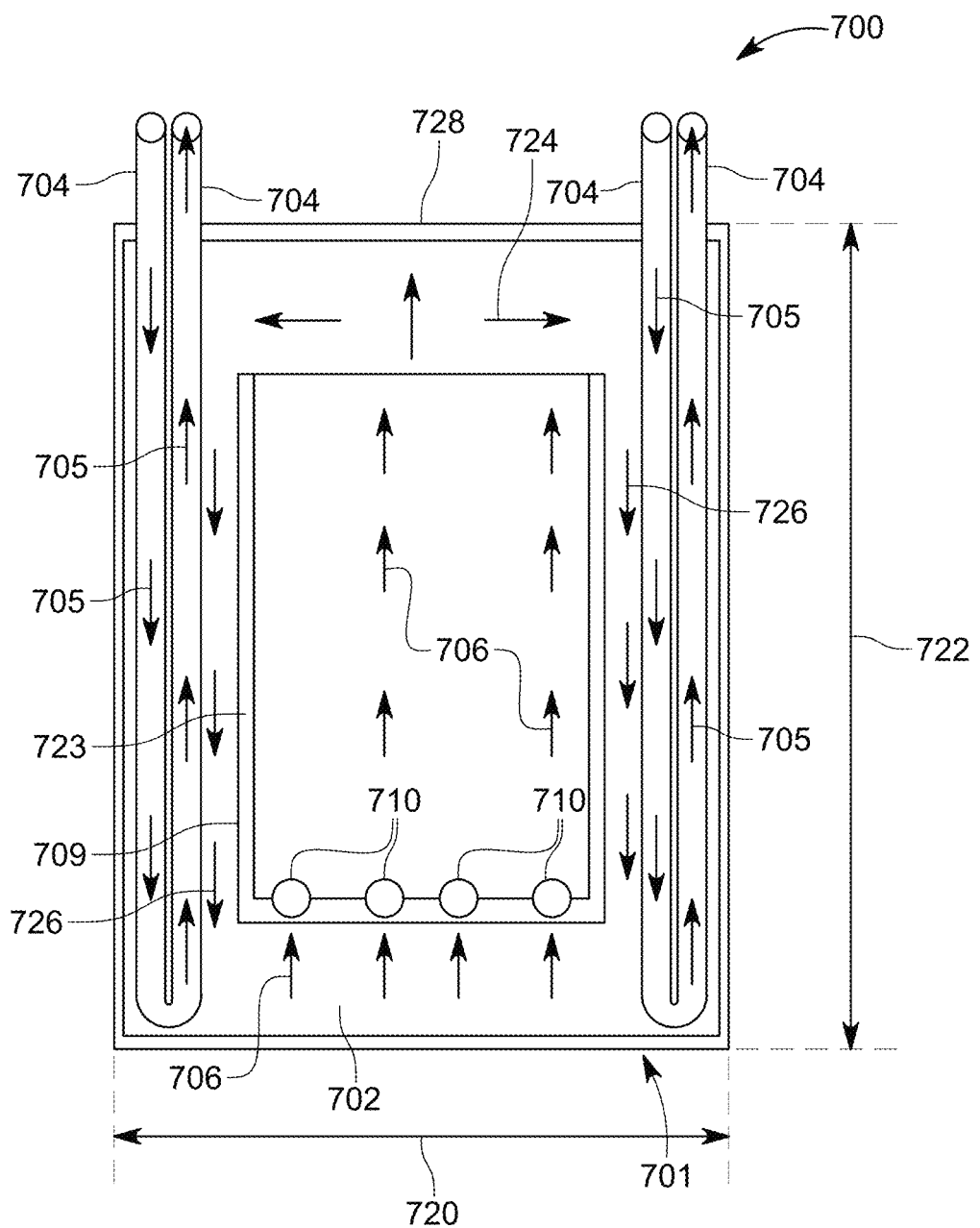
FIG. 8 is an illustration of another embodiment of an electronic component cooling system utilizing a cylindrical barrel.

Referring now to FIG. 8, in one embodiment, the system for cooling electronic components 700 includes the cylindrical container 701. The cylindrical has the outer wall diameter 720 and overall height 722 as discussed herein. The cylindrical container includes a volume of the second cooling fluid 702 and one or more elements 704 that contain and provide for the flow 705 of the first cooling fluid in and out of the cylindrical container. Suitable first and second cooling fluids are discussed herein. As illustrated, the cooling elements 704 are hollow tubes or pipes, containing the first cooling fluid. The primary cooling fluid circulates inside and is fully contained within the cooling pipes.

Disposed in the central area of the interior of the cylindrical container is one or more heat generating electronic components 709 to be cooled. Each includes component includes a chassis 723 that holds and supports all the elements of the electronic component. In one embodiment, spaces or separations are maintained within the cylindrical container including to provide for the flow of the second cooling fluid up through the cylindrical container and the electronic components 706, over the top of the computer equipment 724 and then down toward the bottom of the cylindrical container past the cooling tubes, pipes or elements 726.

The desired circulation of the second cooling fluid is driven or enhanced by one or more pumps 710, which are provided within the chassis of the electronic component and are disposed in the second cooling fluid. Suitable pumps include micro pumps. In one embodiment, each computer component includes four pumps. In one embodiment, each pump is powered by and controlled by the electronic component in which it is located. In one embodiment, the cylindrical barrel includes a lid 728. Therefore, the system for cooling electronic components is completely enclosed within the cylindrical container, and the cooling pipes pass through the lid.

Figure 9:
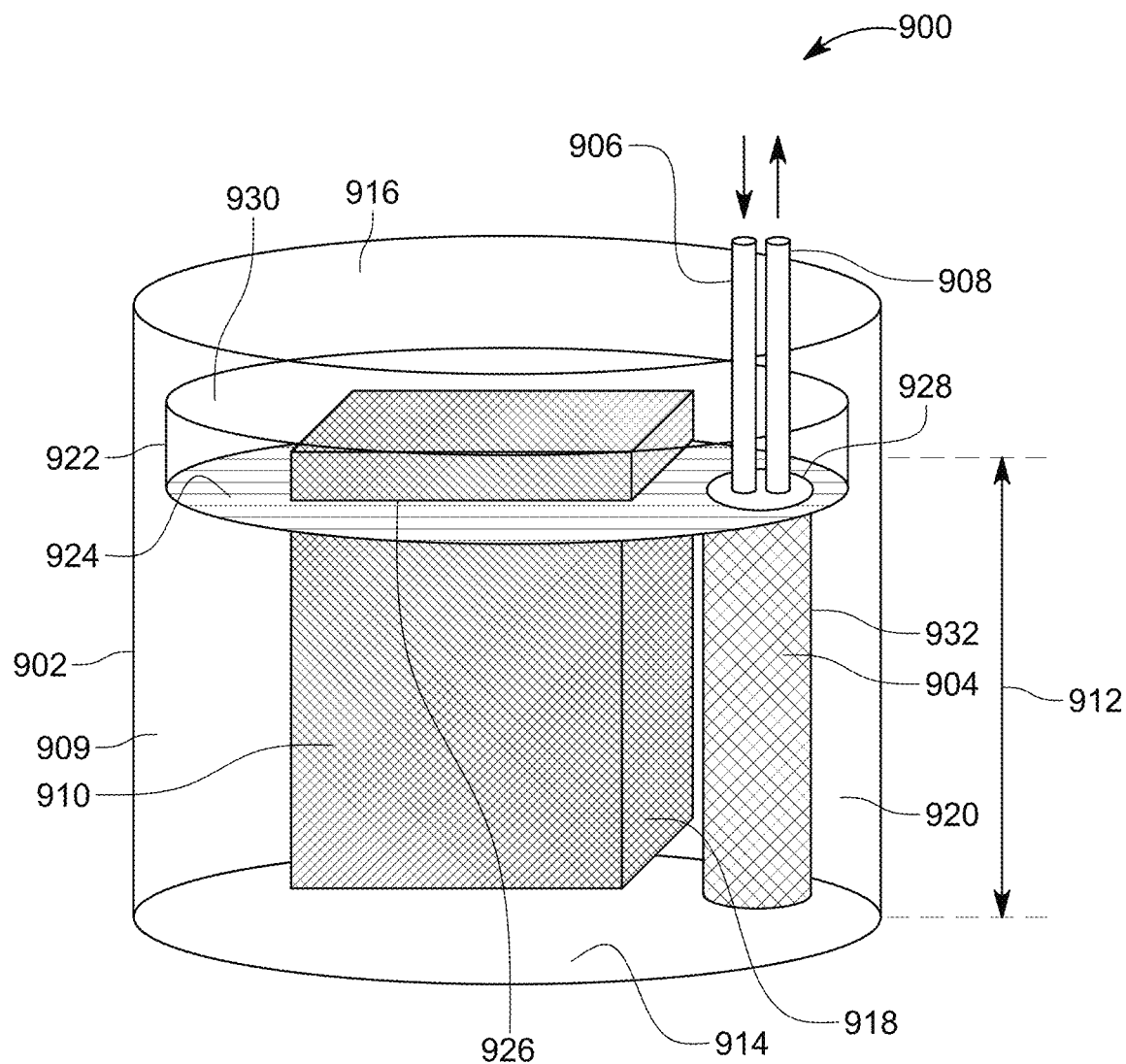
FIG. 9 is an illustration of another embodiment of an electronic component cooling system having a cylindrical container.

Referring now to FIG. 9, an embodiment of a system for immersion cooling electronic components 900 is illustrated. The system includes a cylindrical container 902 having a circular cross section, and at least one cooling element 904 disposed in the cylindrical container. The cooling element contains a first cooling fluid, an inlet 906 including inlet piping for introducing a flow of the first cooling fluid into the cooling element from a source external to the cylindrical container, and an outlet 908, separate from the inlet, and including outlet piping for removing a flow of heated first cooling fluid from the cooling element. In one embodiment, the first cooling fluid is water. While illustrated with a single cooling element, in one embodiment, the system further includes comprises two cooling elements.

A volume of a second cooling fluid 909 disposed in the cylindrical container. The second cooling fluid is an immersion cooling fluid, for example, a dielectric oil. At least one heat generating electronic component 910 is disposed within the cylindrical container and at least partially immersed in the second cooling fluid for exchange of heat between the electronic component and the second cooling fluid. Therefore, each heat generating electronic component and each cooling element is disposed in and in contact with the second cooling fluid. In one embodiment, the electronic component is completely immersed in the second cooling fluid. As discussed herein, at least one fluid circulating device disposed in the second cooling fluid to direct a flow of the second cooling fluid through each electronic component and over the cooling element. In one embodiment, each fluid circulating device is a micropump integrated into the electronic component and receiving power from the electronic component.

In one embodiment, each electronic component has a face that contains the power and communication connections and a depth 912 extending back from the face. In one embodiment, each electronic component is placed within the cylindrical container with the face and associated connections located below the level of second cooling fluid and the depth of the electronic component extending vertically into the cylindrical container toward a bottom 914 of the cylindrical container. Therefore, each electronic component is disposed in the cylindrical container with the face accessible through an open top 916. In one embodiment, the face of each electronic component is rectangular and includes two opposing side edges, a top edge and a bottom edge opposite the top edge. The top and bottom edges extend between the side edges. Two sides extend along the depth from the two side edges. In addition, the top extends along the depth from the top edge, and a bottom extends along the depth from the bottom edge. When the system for cooling electronic components includes a plurality of electronic components arranged, the plurality of electronic components is arranged in the cylindrical container as a stack, for example as a server stack, with the sides of all electronic components aligned. Therefore, the cooling element position between one of the aligned sides 918 of the plurality of electronic components and an interior wall surface 920 of the cylindrical container.

The system for cooling electronic components includes a support as discussed herein. As illustrated, the support, and in particular the support platform that is spaced from the bottom the cylindrical container along a height of the cylindrical container and at a distance at least equal to the depth includes a containment section 922. The container section includes a deck 924. The deck extends horizontally across the cylindrical contain and includes a central opening 926 that accommodates and holds the electronic components. In one embodiment, the deck includes the opposing support rails that engage the opposing side edges of the face of each electronic component and support the electronic component within the cylindrical container. The deck also includes the cooling element opening 928 positioned between the central opening, for example, one of the opposing support rails, and an interior wall of the cylindrical container. The cooling element is disposed in the cooling element opening. In one embodiment, a cooling element pocket 932 extends down from the cooling element opening at least partially toward the bottom of the cylindrical container. The cooling element is disposed within the pocket. The pocket can have solid walls or can have openings along the length of the pocket or at the bottom of the pocket. In general, the pocket is configured to direct a flow of the second cooling fluid over the cooling element.

The containment section includes a lip 930 extending up from the deck in a direction opposite the bottom of the cylindrical container. In one embodiment, the lip extends around the entire periphery of the deck. The deck and lip direct a flow of second cooling fluid emerging from the face of the electronic component through the cooling element opening and along the cooling element as the lip contains the flow of the second cooling fluid within the containment section.

Figure 10:
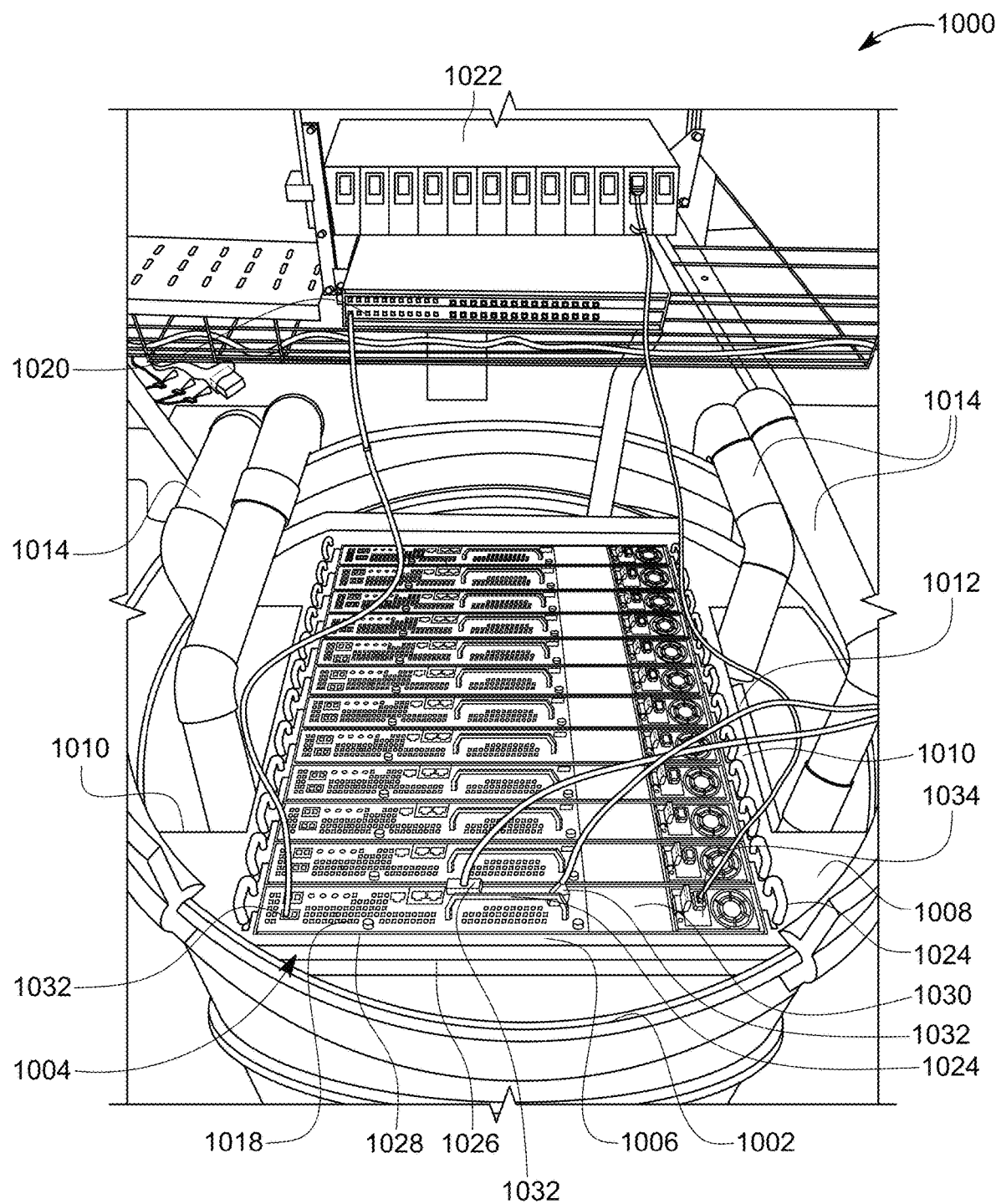
FIG. 10 is an illustration of a top view of an electronic component cooling system containing a plurality of electronic components and two cooling elements.
Figure 11:
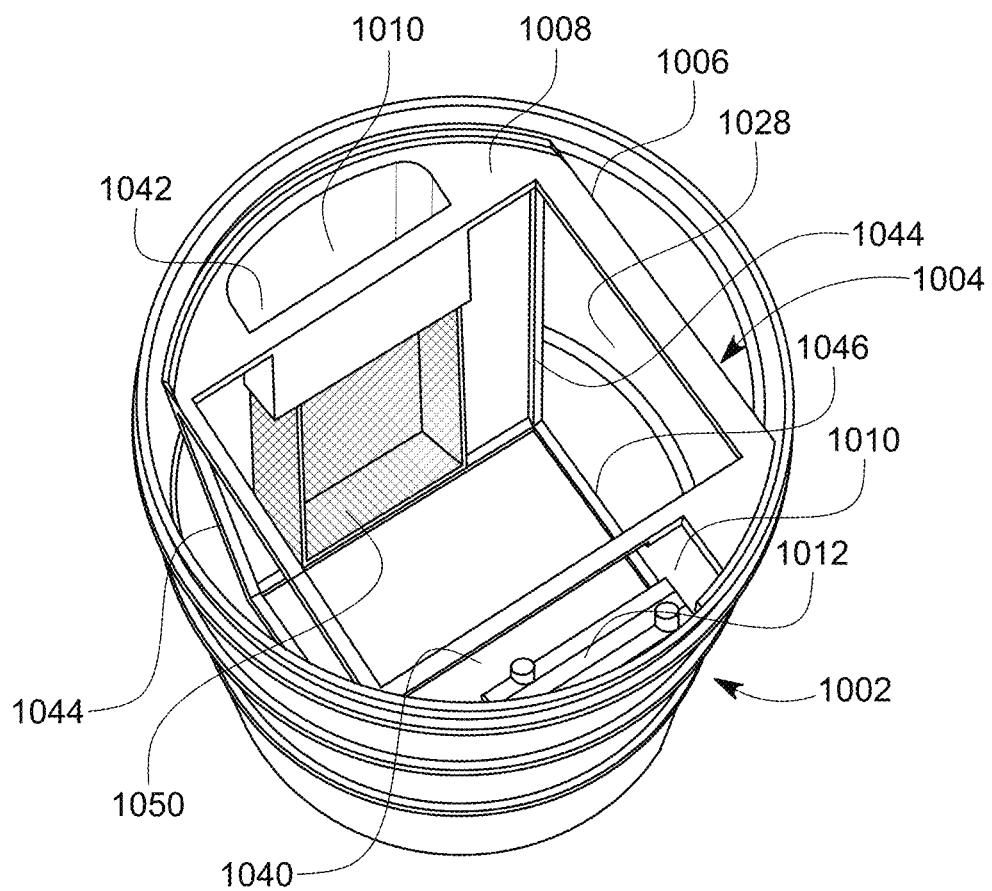
FIG. 11 is an illustration of a top view of a cylindrical containing a support and a cooling element placed in the support.

Referring now to FIGS. 10 and 11, an embodiment, the system for cooling electronic components 1000 is illustrated. The system for cooling electronic components includes the cylindrical container 1002 as discussed herein. As illustrated, the cylindrical container is the metal tank used to ship the second cooling fluid with the top removed. The support 1004 is disposed within the cylindrical container and includes the central opening 1028 that accommodates the plurality of electronic components 1030 arranged as a stack with their faces exposed to the open top of the cylindrical container. Each face includes the communication ports 1032 and power connections 1034 for the electronic component. In one embodiment, each face also includes additional connections for display devices and other input/output devices. In one embodiment, electronic and electrical equipment includes networking devices 1020 and power supplies 1022 provided in proximity to the cylindrical container to provide the desired communication and power to the electronic components.

The support includes the support platform having the containment section with the deck 1008 and the lip 1006 extending up from the deck around the entire periphery of the deck to a point above a fill level 1026 of the second cooling fluid in the cylindrical container. As illustrated, the deck does not completely cover the cross-sectional area of the cylindrical container. Therefore, the shape of the deck is only a portion of a circle or disk. In one embodiment, the deck is circular or disc shaped. In one embodiment, the deck completely covers the cross-sectional area of the cylindrical container. In one embodiment, the deck is shaped to conform to the shape of the interior wall surface of the cylindrical container. The deck includes the central opening 1028 to accommodate the electronic components. In one embodiment, the face 1018 of each electronic component includes one or more handles 1024 to facilitate insertion and removal of that electronic component in the central opening.

The deck also includes two cooling element openings 1010 located on opposite sides of the central opening and in particular on diametrically opposite sides of the central opening. In one embodiment, each cooling element opening is located between one of the aligned sides edges of the electronic components and the interior wall surface of the cylindrical container. A cooling element 1012 is disposed in each cooling element opening in contact with the second cooling fluid. In one embodiment, the piping attached the inlet and outlet of each cooling element is covered with insulation 1014, for example, foam insulation.

Figure 12:
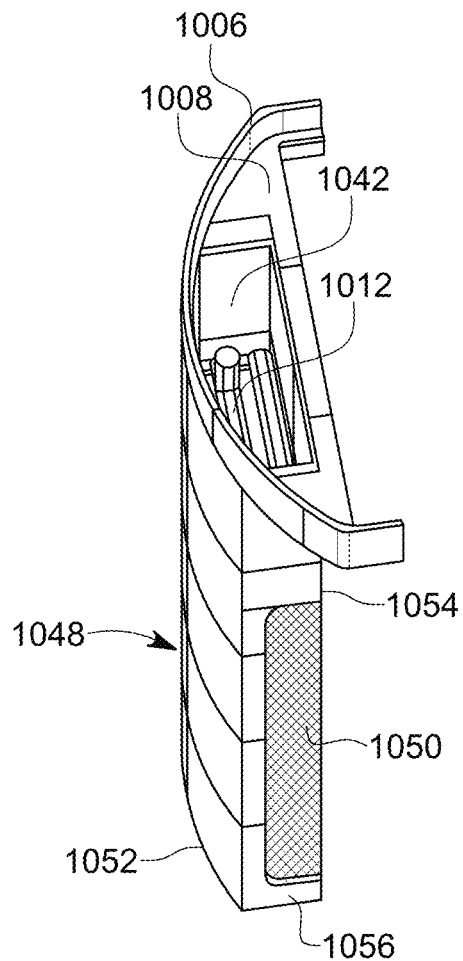
FIG. 12 is an illustration of a portion of an embodiment of a support illustrating a cooling channel containing a cooling element.

As illustrated in FIG. 11, suitable cooling element openings include an opening or window 1040 in the deck with no structure extending below the deck and an channel opening 1042 to a cooling channel or pocket that extends at least partially below the deck. In one embodiment, this cooling channel is formed integral with the containment system. Alternatively, this cooling channel is a separate structure attached to the bottom of the deck. Referring to FIG. 12, an embodiment of a cooling channel 1048 is illustrated. In one embodiment, the cooling channel and other elements of the support can be created using a 3D printer. As illustrated, the cooling channel 1048 extends from the deck to the bottom of the cylindrical tank. Therefore, the cooling element 1012 is completely contained within cooling the channel. In one embodiment, the cooling channel only extends partially to towards the bottom of the cylindrical container. As illustrated in FIG. 12, the deck 1008 and lip 1006 work to contain the second cooling fluid and directed the flow of second colling fluid down through the channel opening 1042.

In one embodiment, the cooling channel includes an exterior vertical face 1052, a pair of opposing sides faces 1056 and an interior vertical face 1054. In one embodiment, the exterior vertical face is curved to accommodate the curved interior wall surface of the cylindrical container. The interior vertical face 1054 is disposed between the cooling element and the heat generating electronic components. In one embodiment, the cooling channel includes a mesh or screen portion 1050 extending at least partially along the length of the cooling channel. This screen portion allows for the flow of the second cooling fluid out of the channel. In one embodiment, the screen portion extends at least partially around to the side faces of the cooling channel.

When the cooling channel extends to the bottom of the cylindrical tank, the cooling channel functions as a support leg for the for the support. Returning to FIG. 11, in one embodiment, the support includes at additional support legs 1044 extending between the deck and base supports 1046 that contact the bottom of the cylindrical tank. In one embodiment, the components of the support are formed as a single or unitary structure. In one embodiment, the support is printed using a 3D printer.

Exemplary embodiments are also directed to methods for constructing a system for cooling electronic components according to any of the embodiments discussed herein including constructing on site at a field location. Exemplary embodiments are directed to a method for immersion cooling electronic components using any of the embodiments of the system for cooling electronic components discussed herein. In one embodiment, one or more cylindrical tanks, for example, cylindrical barrels, are used to ship a cooling fluid, for example, an immersion cooling fluid to a desired location, for example, a field location, where electronic components such as computing components are to be deployed an operated. In one embodiment, the computing components, which are blade type servers, are used in gas and oil surveys. In one embodiment, empty barrels are shipped to the desired location, or a combination of filled barrels and empty barrels are shipped to the desired location.

The top one or more cylindrical barrels is opened. In one embodiment, the top of a cylindrical barrel container the immersion cooling fluid is opened, and at least a portion of the immersion cooling fluid is removed from the cylindrical barrel. A support is placed within one or more of the cylindrical barrels each containing a volume of the immersion cooling fluid. At least one heat generating electronic component and at least one cooling element are placed in each support such that the support is used to hold the at least one heat generating electronic component in the cylindrical barrel such that the electronic component is completely immersed in the immersion cooling fluid. In addition, the at least one cooling element is supported within the support and immersed in the immersion cooling fluid within the cylindrical barrel adjacent the at least one electronic component.

Electronic, electrical and communication connections are made to each electronic component. In addition, each cooling element is plumbed to a source of cooling water that is located external to the cylindrical barrel. In one embodiment, each cooling element is plumbed to a tank of cooling water, a water well, or a surface water source. Cooling water from the source external to the cylindrical barrel is routed through the at least one cooling element, and the electronic components are operated and generate heat.

At least one micropump integrated into the at least one electronic component and deriving power from the at least one electronic component is operated to direct a flow of the immersion cooling fluid vertically up through the at least one electronic component and vertically down over the at least one cooling element to transfer heat from the at least one electronic component through the immersion cooling fluid and to the cooling water for removal from the cylindrical barrel.

The foregoing written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A system for cooling an electronic component, the system comprising:
   a cylindrical container comprising an internal volume, formed by an interior wall and a bottom of the cylindrical container, configured to store dielectric liquid;
   a support, disposed in the internal volume of the cylindrical container, that is configured to retain the electronic component within the dielectric liquid stored in the internal volume of the cylindrical container and control a flow of the dielectric liquid;
   a heat exchanger, disposed in the cylindrical container, that is configured to circulate water from an external environment of the cylindrical container into and out of the internal volume of the cylindrical container, and
   one or more micropumps, integrally formed with and powered by the electronic component, that are configured to circulate the dielectric liquid through the electronic component,
   wherein the support comprises a deck that extends in a direction parallel to the bottom of the cylindrical container, the deck comprising:
      a central opening configured to receive the electronic component, and
      a cooling opening configured to receive the heat exchanger, and
   wherein the support further comprises a lip that extends from the deck in a direction orthogonal to the bottom of the cylindrical container, the lip being configured to extend at least partially around a periphery of the cooling opening of the deck such that the lip directs the flow of the dielectric liquid through the cooling opening.

2. The system of claim 1, wherein the support comprises a 3D printed structure such that the support is formed as a single, unitary component.

3. The system of claim 1, wherein the one or more micropumps are disposed at a bottom of the electronic component or inside the support configured to retain the electronic component such that the one or more micropumps are configured to direct the flow of the dielectric liquid through the electronic component in a direction orthogonal to the bottom of the cylindrical container.

4. The system of claim 1,
   wherein the cooling opening forms an inlet of a cooling channel that extends in the direction orthogonal to the bottom of the cylindrical container and the central opening forms an inlet of a central channel that extends in the direction orthogonal to the bottom of the cylindrical container,
   wherein the cooling channel comprises a screen portion that extends in such a way that the dielectric liquid flows through the screen portion of the cooling channel into the central channel.

5. The system of claim 1, wherein the heat exchanger is at least partially immersed in the dielectric liquid such that the dielectric liquid is configured to conduct heat from the electronic component to the heat exchanger.

6. The system of claim 1, wherein the electronic component is fixed, at its top side, to one or more angle brackets that are configured to engage with a rail of the support such that the electronic component is configured to hang within the cylindrical container at a distance from the bottom of the cylindrical container.

7. The system of claim 1, wherein the electronic component comprises a blade server or a rack server.

8. The system of claim 1, further comprising: a plurality of electronic components, wherein each electronic component of the plurality of electronic components comprises at least one micropump of a plurality of micropumps configured to circulate the dielectric liquid.

9. The system of claim 8, wherein a cardinality of the plurality of micropumps is configured based on a heat load to be removed from each electronic component by the one or more micropumps.

10. A method for cooling an electronic component, the method comprising:

retaining the electronic component, with a support, in dielectric liquid stored in an internal volume of a cylindrical container, where the internal volume is formed by an interior wall and a bottom of the cylindrical container;

circulating water from an external environment of the cylindrical container into and out of the internal volume of the cylindrical container with a heat exchanger disposed in the cylindrical container;

circulating the dielectric liquid through the electronic component with one or more micropumps integrally formed with the electronic component;

receiving the electronic component in a central opening of a deck of the support that extends in a direction parallel to the bottom of the cylindrical container;

receiving the heat exchanger in a cooling opening of the deck of the support; and directing a flow of the dielectric liquid through the cooling opening with a lip of the support, where the lip extends from the deck in the direction orthogonal to the bottom of the cylindrical container and further extends at least partially around a periphery of the cooling opening of the deck.

11. The method of claim 10, further comprising: directing a flow of the dielectric liquid through the electronic component in a direction orthogonal to the bottom of the cylindrical container with the one or more micropumps, where the one or more micropumps are disposed at a bottom of the electronic component.

12. The method of claim 10, further comprising:
circulating the dielectric liquid through a screen portion of a cooling channel,
wherein the cooling opening forms an inlet of the cooling channel, and the cooling channel extends in the direction orthogonal to the bottom of the cylindrical container, and
wherein the central opening forms an inlet of a central channel that extends in the direction orthogonal to the bottom of the cylindrical container.

13. The method of claim 10, further comprising: at least partially immersing the heat exchanger in the dielectric liquid such that the dielectric liquid conducts heat from the electronic component to the heat exchanger.

14. The method of claim 10, further comprising fixing the electronic component, at its top side, to one or more angle brackets that engage with a rail of the support such that the electronic component hangs within the cylindrical container at a distance from the bottom of the cylindrical container.

15. The method of claim 10, further comprising:
circulating the dielectric liquid with a plurality of micropumps, and
integrating the plurality of micropumps with a plurality of electronic components in such a way that each electronic component of the plurality of electronic components comprises at least one micropump of the plurality of micropumps.

16. The method of claim 15, wherein a cardinality of the plurality of micropumps is configured based on a heat load to be removed from each electronic component by the one or more micropumps.

* * * * *